US012751290B2

(12) United States Patent
Ku et al.

(10) Patent No.: US 12,751,290 B2
(45) Date of Patent: Sep. 29, 2026

(54) DEVICES WITH THROUGH SILICON VIAS, GUARD RINGS AND METHODS OF MAKING THE SAME

(71) Applicant: Taiwan Semiconductor Manufacturing Co., Ltd., Hsinchu (TW)

(72) Inventors: Min-Feng Ku, Hsinchu (TW); Yao-Chun Chuang, Hsinchu (TW); Ching-Pin Lin, Hsinchu (TW); Cheng-Chien Li, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 314 days.

(21) Appl. No.: 18/741,643

(22) Filed: Jun. 12, 2024

(65) Prior Publication Data

US 2024/0332218 A1 Oct. 3, 2024

Related U.S. Application Data

(62) Division of application No. 17/481,003, filed on Sep. 21, 2021, now Pat. No. 12,046,566.

(60) Provisional application No. 63/148,079, filed on Feb. 10, 2021.

(51) Int. Cl.

| | |
|---|---|
| ***H10W 42/00*** | (2026.01) |
| ***H10W 20/00*** | (2026.01) |
| ***H10W 20/20*** | (2026.01) |

(52) U.S. Cl.

CPC ......... *H10W 42/00* (2026.01); *H10W 20/023* (2026.01); *H10W 20/20* (2026.01)

(58) Field of Classification Search

CPC ... H10W 42/00; H10W 20/023; H10W 20/20; H10W 20/0234; H10W 20/2134; H10W 20/481

See application file for complete search history.

(56) References Cited

U.S. PATENT DOCUMENTS

| | | | | |
|---|---|---|---|---|
| 8,232,648 | B2 | 7/2012 | McGahay et al. | |
| 2016/0079166 | A1* | 3/2016 | Farooq | H10W 20/20 257/529 |
| 2020/0006128 | A1 | 1/2020 | Weng et al. | |
| 2020/0411379 | A1* | 12/2020 | Li | H10W 20/023 |

FOREIGN PATENT DOCUMENTS

| | | | |
|---|---|---|---|
| DE | 102021100457 | A1 | 7/2022 |
| TW | 201631724 | A | 9/2016 |

* cited by examiner

*Primary Examiner* — Calvin Y Choi

(74) *Attorney, Agent, or Firm* — Seed Intellectual Property Law Group LLP

(57) ABSTRACT

A semiconductor article which includes a semiconductor substrate, a back end of the line (BEOL) wiring portion on the semiconductor substrate, a through silicon via and a guard ring. The semiconductor substrate is made of a semiconductor material. The BEOL wiring portion includes a plurality of wiring layers having electrically conductive wiring and electrical insulating material. The through silicon via provides a conductive path through the BEOL wiring portion and the semiconductor substrate. The guard ring surrounds the through silicon via in the BEOL wiring portion and in some embodiments in the semiconductor substrate.

20 Claims, 23 Drawing Sheets

DEVICES WITH THROUGH SILICON VIAS, GUARD RINGS AND METHODS OF MAKING THE SAME

BACKGROUND

Technical Field

The present disclosure relates to the field of through silicon vias and guard rings.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Semiconductor devices or chips (hereafter referred to as just "chips") may consist of a semiconductor substrate where all of the front end of the line (FEOL) processing is typically done to form the semiconductor transistors, capacitors, etc., and a back end of the line (BEOL) wiring where multiple wiring layers are formed to connect the various transistors, capacitors, etc., in the semiconductor substrate. The BEOL wiring may also have input/output (I/O) pads for connecting the chip to a next level of packaging such as a printed circuit board or a ceramic substrate. The semiconductor substrate is made from a semiconductor material while the BEOL wiring is made from metallic materials for wiring and dielectric material for insulation.

Current semiconductor chips may have a through silicon via (TSV) which partially or entirely extends through the semiconductor substrate and the BEOL wiring. Such a through silicon via may be used, for example, to connect two chips by stacking them one on top of the other. In some situations, the TSV passes completely through the semiconductor substrate. TSVs can be characterized as via-first TSVs which are formed before individual devices are formed, via-middle TSVs which are formed after individual devices are formed but before BEOL layers are formed or via-last TSVs which are formed after or during the formation of BEOL layers.

DETAILED DESCRIPTION

Figure 1A:
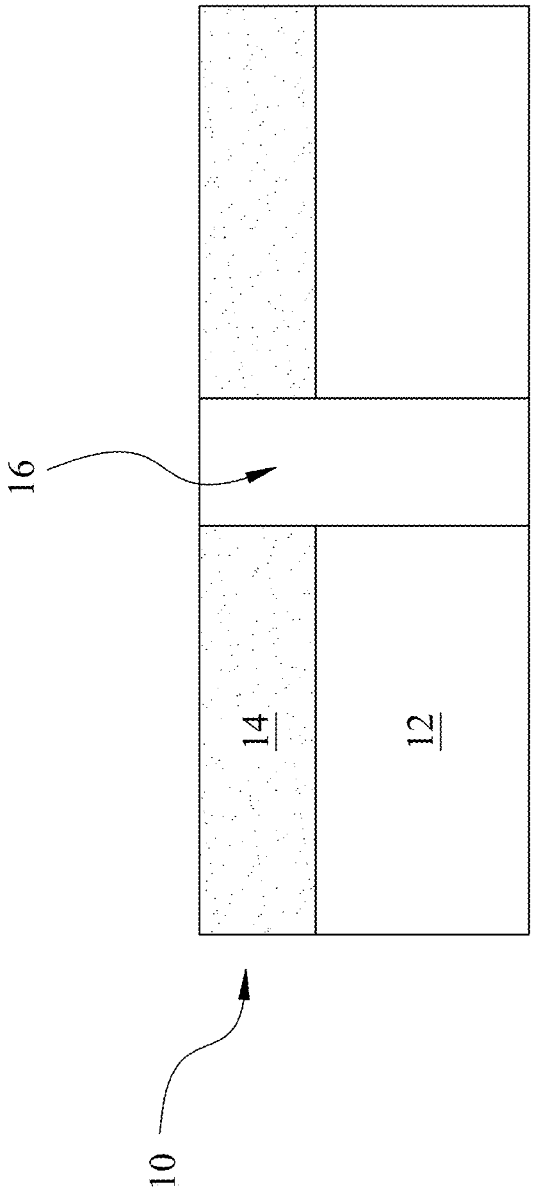
FIGS. 1A and 1B are cross-sectional views illustrating a method of forming a through silicon via in a semiconductor chip.

In the following description, thicknesses and materials may be described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in their entirety such that the dimension referred to as the vertical direction is oriented horizontally and, at the same time, the dimension referred to as the horizontal direction is oriented vertically.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The various advantages and purposes of embodiments in accordance with the present disclosure as described above and hereafter are achieved by providing, according to a first aspect of the disclosed embodiments, a semiconductor structure which includes a semiconductor substrate including a semiconductor material. The semiconductor structure further includes a back end of the line (BEOL) wiring portion on the semiconductor substrate. The back end of line wiring portion includes a plurality of wiring layers having conductive, e.g., metal layers, and insulating material. A through silicon via is present in the back end of line wiring portion and in the semiconductor substrate. The semiconductor structure includes a guard ring surrounding the through silicon via in the back end of line wiring portion, the guard ring including a plurality of guard ring elements, each of the plurality of guard ring elements including an upper section and a lower section. The upper section of each of the plurality of guard ring elements includes a first surface and a second surface spaced apart a distance $W_a$, the first surface being closer to the through silicon via than the second surface. The lower section of each of the plurality of guard ring elements includes a first surface and a second surface spaced apart a distance $W_b$, the first surface of the lower section being closer to the through silicon via than the second surface of the lower section. In accordance with some disclosed embodiments, $W_a$ is different than $W_b$ and the first surface of one of the plurality of guard ring elements is coplanar with the first surface of another one of the plurality of guard ring elements.

According to a second aspect of embodiments disclosed herein, a method is provided of forming a semiconductor structure which includes a step of providing a semiconductor substrate including a semiconductor material. The method further includes a step of forming a back end of line (BEOL) wiring portion, the back end of line wiring portion including a plurality of conductive, e.g., metal layers, an insulating material and a guard ring. The guard ring includes a plurality of guard ring elements. Each of the plurality of guard ring elements includes an upper section and a lower section. The upper section of each of the plurality of guard ring elements includes a first surface and a second surface spaced apart a distance $W_a$, the first surface being closer to the through silicon via than the second surface. The lower section of each of the plurality of guard ring elements includes a first surface and a second surface spaced apart a distance $W_b$, the first surface of the lower section being closer to the through silicon via than the second surface of the lower section. In accordance with some embodiments, $W_a$ is different than $W_b$, and the first surface of one of the plurality of guard ring elements is coplanar with the first surface of another one of the plurality of guard ring elements. Disclosed methods further include a step of forming a through silicon via opening surrounded by the guard ring in the BEOL wiring portion and the semiconductor substrate. In accordance with some embodiments of the present disclosure the method includes metallizing the through silicon via opening.

According to a third aspect of the embodiments described herein, a semiconductor device is provided which includes a semiconductor substrate comprising a semiconductor material. The semiconductor device includes a back end of line (BEOL) wiring portion on the semiconductor substrate, the back end of line wiring portion including a plurality of conductive, e.g., metal, layers and an insulating material. The semiconductor device also includes a through silicon via (TSV) in the semiconductor substrate and in the back end of line wiring portion, the through silicon via in the semiconductor substrate having a dimension $D_b$ adjacent the back end of line wiring portion and a dimension $D_c$ in the semiconductor substrate adjacent a surface of the semiconductor substrate opposite a surface adjacent the back end of line wiring portion. In some embodiments Db being greater than Dc. The device further includes a guard ring surrounding the through silicon via in the back end of line wiring portion. The guard ring includes a plurality of guard ring elements. Each of the plurality of guard ring elements includes an upper section and a lower section. The upper section of each of the plurality of guard ring elements includes a first surface and a second surface spaced apart a distance $W_a$, the first surface being closer to the through silicon via than the second surface. The lower section of each of the plurality of guard ring elements includes a first surface and a second surface spaced apart a distance $W_b$, the first surface of the lower section being closer to the through silicon via than the second surface of the lower section. In some embodiments, $W_a$ is different than $W_b$.

Figure 1B:
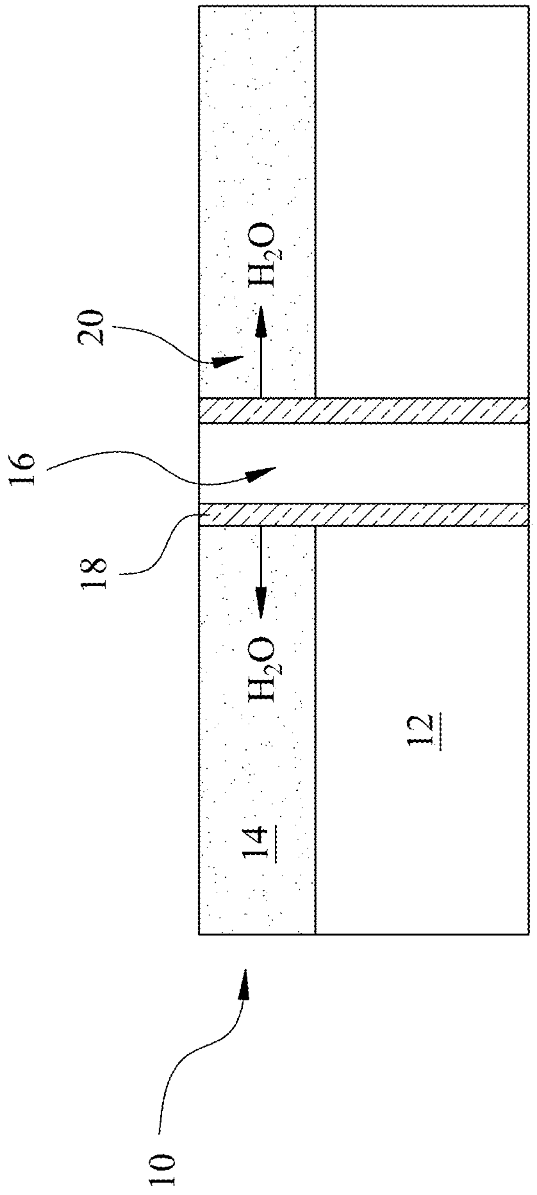

Referring to the figures in more detail, FIGS. 1A and 1B illustrate a method of forming a through silicon via. Referring first to FIG. 1A, a semiconductor chip 10 includes a semiconductor substrate 12 and BEOL wiring 14. It is to be understood that only a portion of semiconductor chip 10 is shown in FIGS. 1A and 1B. The semiconductor substrate 12 has undergone front end of the line (FEOL) processing to form various individual devices such as transistors, capacitors and the like in the semiconductor substrate 12. Such individual devices are not shown for clarity. The BEOL wiring 14 includes multiple layers (not shown) of electrically conductive material, e.g., metallic wiring within an insulating dielectric material. The precise details of BEOL wiring 14 are well known to those skilled in the art and are not shown or described here. Also shown in FIG. 1A is a through silicon via opening 16 which has been etched through the BEOL wiring 14 and semiconductor substrate 12.

Referring to FIG. 1B, an insulating material 18, may then be deposited on the walls of the through silicon via opening 16. In one process for depositing the insulating material 18, O3/TEOS (Tetraethyl orthosilicate) is used. A byproduct of the formation of the insulating material 18 using O3/TEOS (Tetraethyl orthosilicate) is the production of water which can migrate into the dielectric material of the BEOL wiring 14, as indicated by arrows 20 in FIG. 1B. Water can be detrimental to the insulating material of the BEOL wiring 14 and it can be detrimental to the materials forming the electrically conductive features of the BEOL. For example, the electrically conductive features of the BEOL include features that include barrier layers, e.g., TiN, TaN or the like and electrically conductive metals, such as copper or aluminum. When the water produced during the formation of the insulating material 18 migrates into the dielectric material of the BEOL wiring 14, it can promote the oxidation of the barrier layer of the BEOL wiring features. Such oxidation weakens the barrier layer, such that the conductive material, e.g., copper or aluminum, of the BEOL wiring can diffuse through the barrier layer and form metal nodules in the insulating dielectric material of the BEOL wiring 14. These metal nodules can eventually coalesce and form an unwanted electrical path between BEOL wiring features within the insulating dielectric material. For example, when the BEOL wiring features are subjected to a voltage bias, e.g., during testing or normal operation, the BEOL metal can migrate through the weakened barrier layer and form the metal nodules.

Continuing to refer to FIG. 1B, the through silicon via opening 16 is metallized by depositing a metallic material, such as copper or aluminum, into the through silicon via opening 16 using techniques such as electroplating techniques. The through silicon via opening 16 may also include a liner layer, such as TiN or Ta/TaN.

Figure 2A:
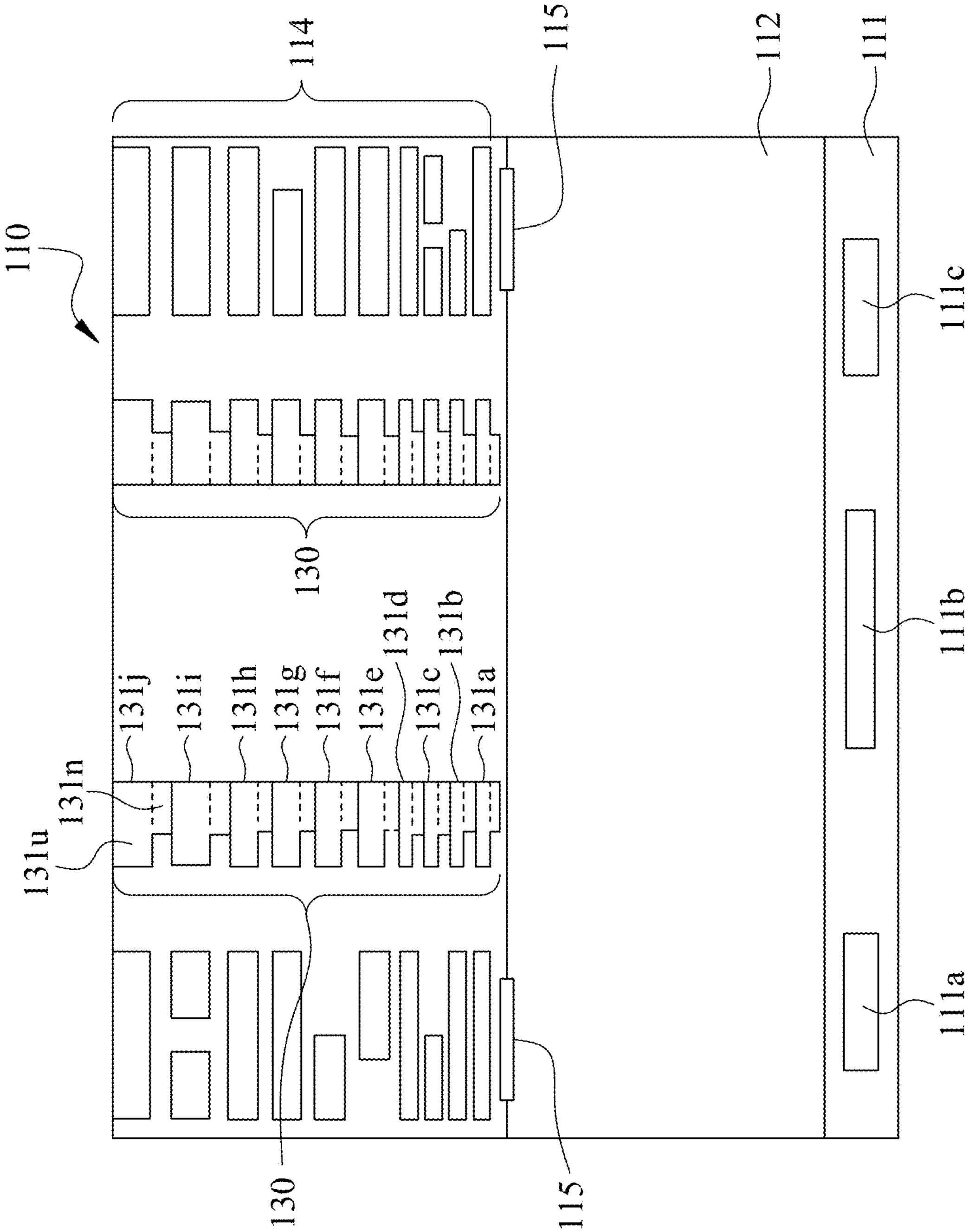
FIGS. 2A to 2F are cross-sectional views illustrating a method of forming a through silicon via and top layer metallization in accordance with some embodiments of the present disclosure.

Referring now to FIGS. 2A to 2D, an embodiment of the present disclosure is illustrated. Referring first to FIG. 2A, a semiconductor chip 110 includes a semiconductor substrate 112 and BEOL wiring 114 on one side of semiconductor substrate 112. An additional wiring layer 111 is present on an opposite side of semiconductor substrate 112 and includes a plurality of conductive features 111*a*, 111*b* and 111*c*. For clarity, the semiconductor substrate 112 is not shown in cross section so structures or devices within the semiconductor substrate 112 are not visible; however, such structures or devices are present in semiconductor substrate 112 and are schematically represented by box 115. Such structures or devices include semiconductor structure such as transistors. It is to be understood that only a portion of semiconductor chip 110 is shown in FIGS. 2A to 2D. Some suitable materials for semiconductor substrate 112 include, but are not limited to, group IV semiconductors such as silicon, silicon germanium or germanium, a III-V compound semiconductor, or a II-VI compound semiconductor. The metallization of the BEOL wiring 114 is usually copper but can also be other conductive materials, such as aluminum. The dielectric insulation material of BEOL wiring 114 may be any suitable material such as silicon dioxide, silicon nitride or SiCOH (a compound consisting of silicon, carbon, oxygen and hydrogen).

The semiconductor substrate 112 has undergone front end of the line (FEOL) processing to form the various individual devices such as transistors, capacitors and the like in the semiconductor substrate 112. Such individual devices are not shown for clarity. The BEOL wiring 114 includes multiple layers (not shown) of metallic wiring within an insulating dielectric material. The precise details of BEOL wiring 114 are well known to those skilled in the art and do not need to be described in more detail. Also shown in FIG. 2A is guard ring 130, which in some embodiments may be formed in the same sequence and at the same time as the formation of individual wiring layers of BEOL wiring 114 and interconnections or vias between the different metallic wiring layers. The guard ring may or may not be connected electrically to the metallization of the BEOL wiring 114. When guard ring 130 is formed in the same sequence and at the same time as the formation of the individual wiring layers of the BEOL wiring 114 and the vias therebetween, the guard ring includes multiple segments or sections identified as 131*a*-131*j*. Each of these segments 131*a*-131*j* includes an upper wider portion 131*u* which is formed during the same process that forms a layer of BEOL wiring and a lower narrower portion 131*n* which is formed during the same process that forms a via between adjacent BEOL wiring layers. The formation of guard ring 130 will be discussed in more detail below. In one embodiment of the embodiments described herein, the guard ring 130 is a ring or fence of electrically conductive material, such as a metallic material that encloses the area where the through silicon via will be formed. In the illustrated embodiment, guard ring 130 extends at least the entire vertical length of the BEOL wiring 114.

Figure 2B:
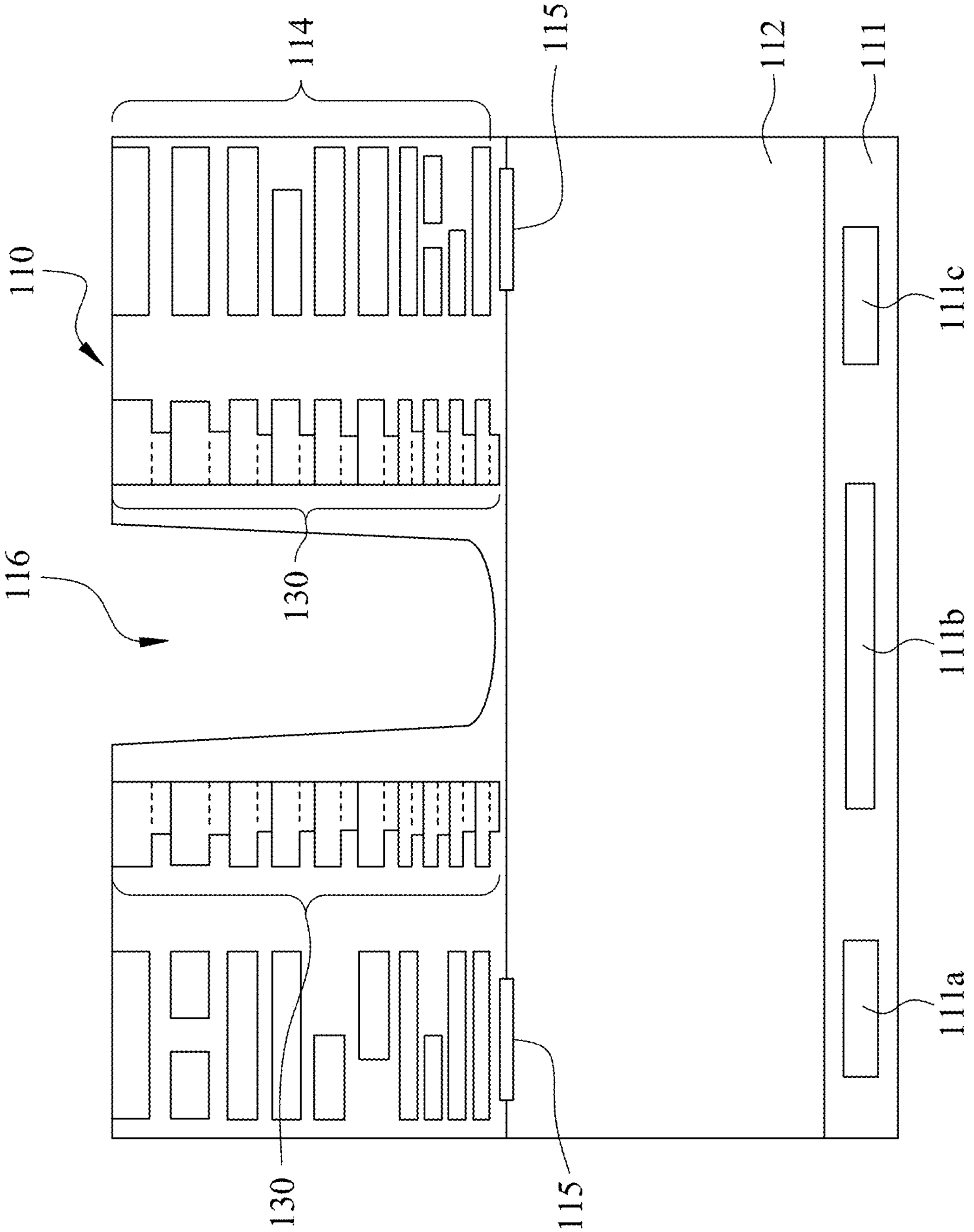
Figure 2C:
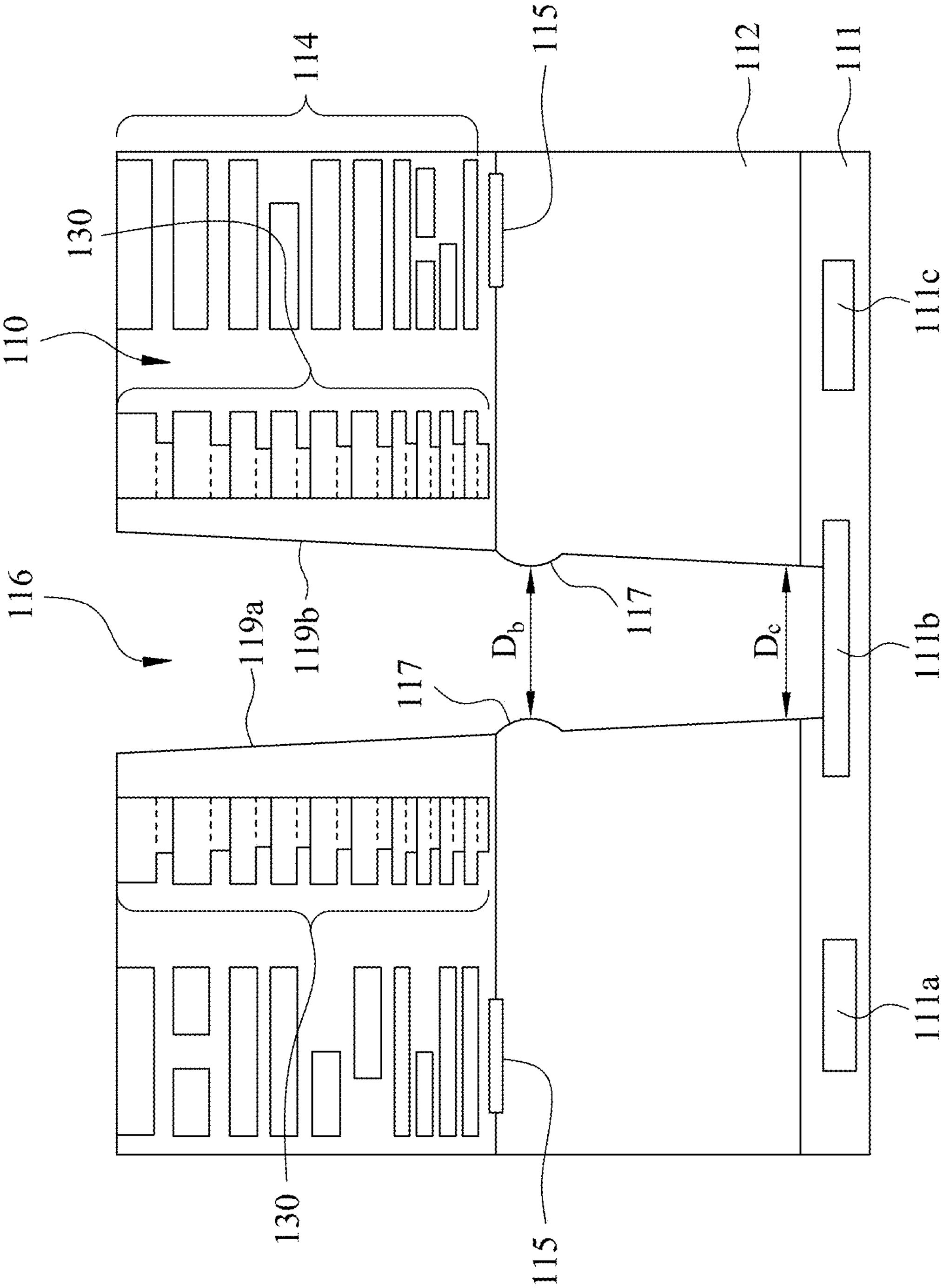

Shown in FIG. 2B is a through silicon via opening 116 which has been etched through the BEOL wiring 114 using dielectric or conductor etch techniques such as a gas plasma etching. As illustrated in FIG. 2C, the through silicon via opening 116 extends into a portion of the additional wiring layer 111 where it terminates at conductive feature 111*b*. The etching process employed can be an isotropic dry etch process, such as a Bosch process. As a result of using an isotropic etch process (as opposed to an anisotropic etch process), a recess that extends laterally as well as vertically is formed. Generally, a Bosch process involves introducing a first gas that etches the substrate until the desired depth of the recess is reached, at which point the first gas is stopped and a second gas is introduced that creates a protective liner along the surface of the sidewalls. When the first gas is reintroduced, the first gas removes the protective liner along the bottom of the recess (leaving the protective liner along the sidewalls) and continues etching the substrate along the bottom of the recess. The process of introducing the first gas and the second gas is repeated until the desired depth is achieved.

For example, an etching gas, such as $SF_6$, may be used as the etchant. The process described above may be repeated any number of times to create an opening of the desired depth. After forming the opening to the desired depth, the opening may be filled with a conductive material to form TSV 122 in FIG. 2E. An insulating layer (118 in FIG. 2D) is formed along sidewalls of the opening to create a diffusion barrier to prevent the conductive material, such as copper, from diffusing into the substrate 112 and/or one or more dielectric layers such as the dielectric material of additional wiring layer 111. The insulating layer 118 may be formed, for example, by physical vapor deposition (PVD), chemical vapor deposition (CVD), atomic layer deposition (ALD), spin-on deposition, or other suitable methods. After the insulating layer 118 is formed, a conductive material is used to form the TSV 122. The conductive material may be, for example, copper, tungsten, aluminum, silver, combinations thereof, or the like. In an embodiment, a seed layer (not shown) is formed over the insulating layer 118, and an electro-deposition process is utilized to fill the opening, although other suitable methods, such as electroless deposition, plating, or CVD, may also be used. The process may include overfilling the opening and removing excess conductive material located outside of the TSV openings using, for example, a process such as chemical mechanical polishing (CMP), etching, combinations thereof, or the like.

In FIG. 2C, the through silicon via opening 116 has been extended through the semiconductor substrate 112 using etch processes, such as plasma etching. The through silicon via opening 116 in FIG. 2C is illustrated as being extended through the semiconductor substrate 112 and into additional wiring layer 111, in other embodiments, the silicon via opening does not extend through the semiconductor substrate 112, but rather extends through a portion of the semiconductor substrate 112 to metal features on an opposite side of the portion of semiconductor substrate 112 illustrated in FIG. 2C. The location of the through silicon via opening 116 has been chosen so as to be within the guard ring 130. While through silicon via opening 116 is shown as being etched entirely through the BEOL wiring 114 and semiconductor substrate 112, it is within the scope of the present disclosure for through silicon via opening 116 to be etched only partially through the BEOL wiring 114 and/or partially through the semiconductor substrate 112.

In some embodiments of the present disclosure, as best seen in FIG. 2C, the process of extending the through silicon via opening 116 through the semiconductor substrate 112 does not remove a portion of the semiconductor substrate 112 near the interface between the semiconductor substrate 112 and the BEOL wiring 114. These remaining portions of the semiconductor substrate 112 are identified as protrusions 117. Without being bound to a theory, protrusions 117 are likely a result of a portion of the semiconductor substrate 112 being shielded from the etchant material, used to etch the semiconductor substrate 112 to extend the through silicon via opening 116, by the portion of the insulating dielectric material of BEOL wiring 114 that remains after the through silicon via opening 116 is formed in the BEOL wiring 114. This remaining portion is best illustrated in FIG. 2B and is located at the bottom of the through silicon via opening 116 formed in the dielectric insulating material of the BEOL wiring 114. In accordance with some embodiments of the present disclosure, a second etching step is performed in order to remove the protrusions 117 and produce a more planar wall of the through silicon via opening 116. In one embodiment, the protrusions 117 are removed using the same type of etching process as the etching process used to extend the through silicon via opening 116 into the semiconductor substrate 112. In other embodiments, the protrusions 117 are removed using a different type of etching process than the etching process used to extend the through silicon via opening 116 into the semiconductor substrate 112. Removal of the protrusions 117 is desirable in order to reduce stress concentrations in the material of the semiconductor substrate 112.

Figure 2D:
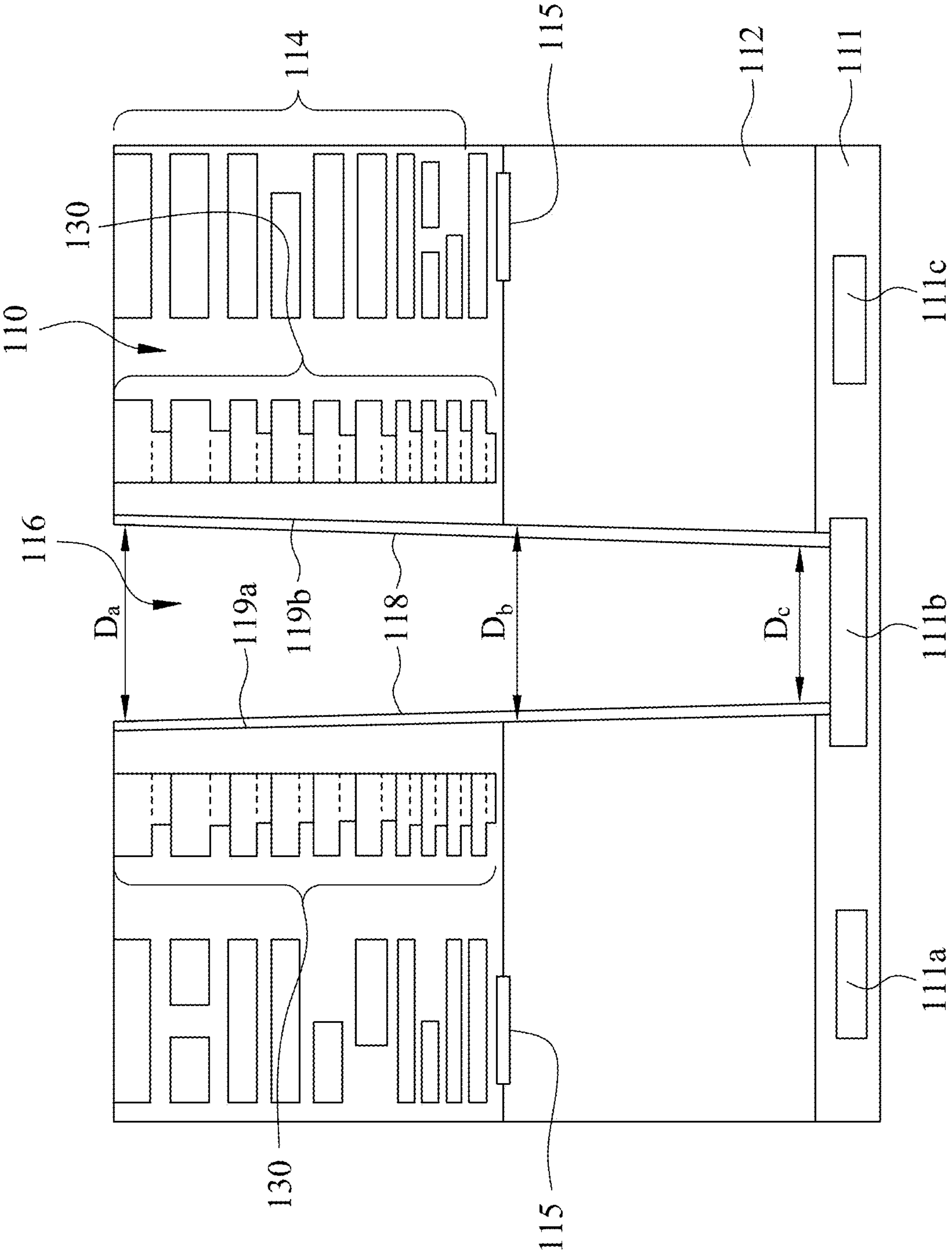

Referring to FIG. 2D, the top of the through silicon via opening 116 (adjacent the top of the BEOL wiring 114) in FIG. 2D includes a dimension $D_a$ which represents a lateral distance between the left side wall 119*a* and the right side wall 119*b* of through silicon via opening 116. In some embodiments, $D_a$ is in the range of 1.5 to 3 micrometers. The bottom of the through silicon via opening 116 (adjacent the bottom of the semiconductor substrate 112) includes a dimension $D_c$ which represents a lateral distance between the left sidewall 119*a* and the right side wall 119*b* of through silicon via opening 116. $D_c$ is less than $D_a$. Adjacent the interface between BEOL wiring 114 and semiconductor substrate 112, the through silicon via opening 116 includes a dimension $D_b$ which represents a lateral distance between the left sidewall 119*a* and the right side wall 119*b* of through silicon via opening 116. $D_b$ is less than $D_a$ and greater than $D_c$. In accordance with some embodiments of the present disclosure, satisfactory removal of protrusions 117 are indicated when $D_b$ is greater than $D_c$. $D_b$ less than $D_c$, as illustrated in FIG. 2C, is an indication that satisfactory removal of protrusions 117 has not been achieved. As noted above, unsatisfactory removal of protrusions 117 is undesirable due to the stress concentrations that are present when protrusions 117 are present.

After successful removal of protrusions 117, as discussed above, an insulating material 118, e.g., an oxide or a low k dielectric material, is formed on the walls of the through silicon via opening 116. The insulating material serves to electrically isolate the conductive material from the Si substrate. The particular insulating material used and its thickness can affect the performance of the TSV, e.g., its capacitance and current leakage. In one process for depositing the insulating material 118, O3/TEOS (Tetraethyl orthosilicate) is used. In some embodiments, the insulating material 118 may have a thickness of about 1 micrometer. As discussed above, a byproduct of the formation of the insulating material 118 is the production of water which can migrate into the dielectric material of the BEOL wiring 114. As noted above, water can be detrimental to the insulating material of the BEOL wiring 114 and it can be detrimental to the materials forming the electrically conductive features of the BEOL. For example, the electrically conductive features of the BEOL include features that include barrier layers, e.g., TiN, TaN or the like and electrically conductive metals, such as copper or aluminum at least partially surrounded by the barrier layers. As noted above, when the water produced during the formation of the insulating material 118 migrates into the dielectric material of the BEOL wiring 114, it can promote the oxidation of the barrier layer of the BEOL wiring features. Such oxidation weakens the barrier layer, such that the conductive material, e.g., copper or aluminum, of the BEOL wiring can diffuse through the barrier layer and form metal nodules in the insulating dielectric material of the BEOL wiring 114. For example, when the BEOL wiring features are subjected to a voltage bias, e.g., during testing or normal operation, the BEOL metal can migrate through the weakened barrier layer and form the metal nodules. These metal nodules can eventually coalesce and form an unwanted electrical path between BEOL wiring features within the insulating dielectric material. In accordance with embodiments of the present disclosure, guard ring 130 blocks water formed during the formation of the insulating layer 118 from passing beyond the guard ring 130 where the water could damage the barrier layer of the BEOL wiring features.

Figure 2E:
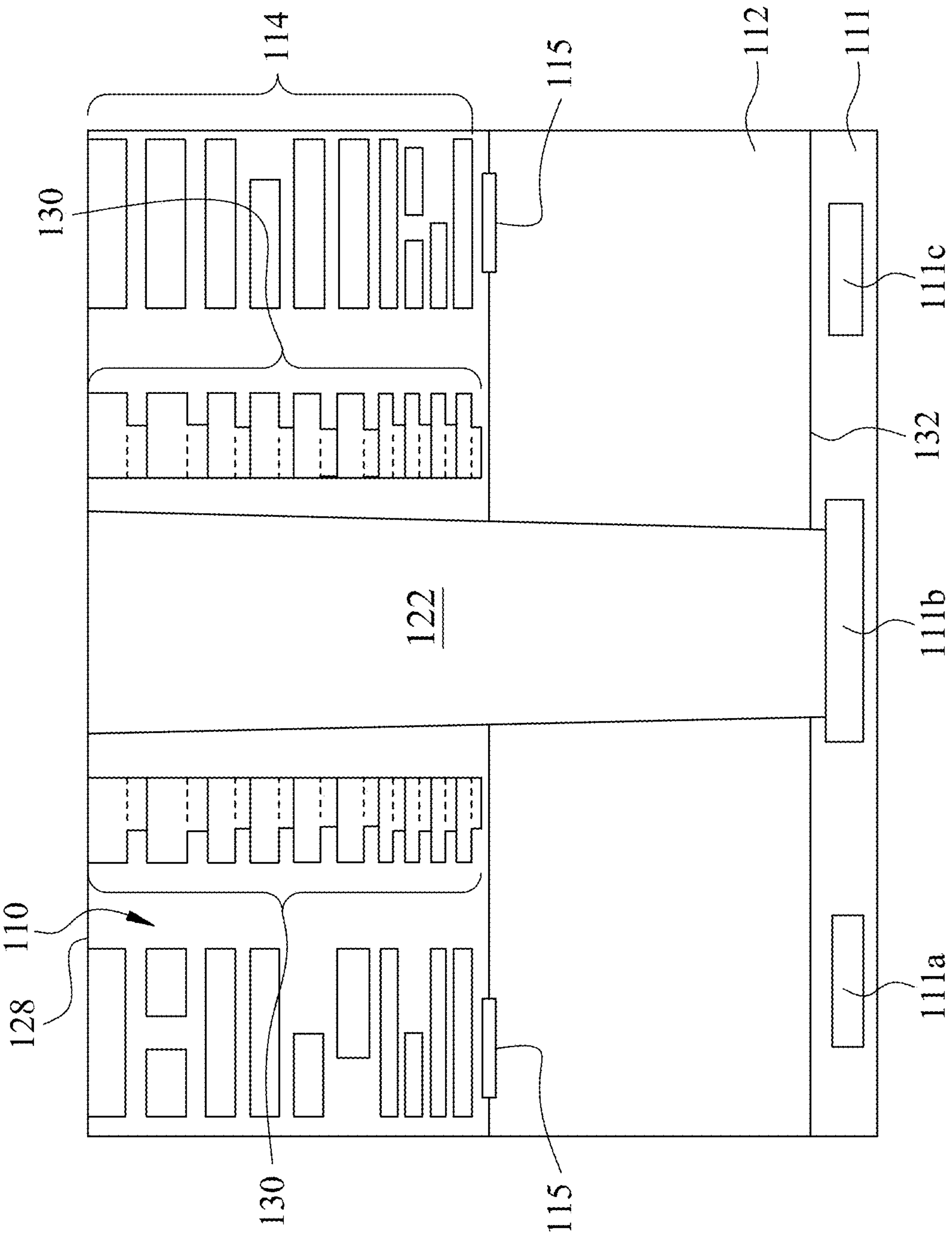

Next, the through silicon via opening 116 is metallized by depositing a metallic material 122, such as copper or aluminum, into the through silicon via opening 116 resulting in the structure shown in FIG. 2E. The through silicon via opening 116 may also include the insulating layer or liner layer, such as TEOS, Ti, TiN, Ta or TaN not shown in FIG. 2E. The liner layer may have a thickness of about 10 nm-100 nm. If there is incomplete coverage of the wall of the through silicon via opening 116 by the liner layer, this may allow for diffusion of the metallization 122, particularly if it is copper, into the wiring layers of the BEOL wiring 114. However, the presence of guard ring 130 prevents the metallization 122 from entering the functional portion of the wiring layers of the BEOL wiring 114. In another embodiment of the present disclosure, the liner layer may be dispensed with since any migration of the metallization 122 into the functional portion of the BEOL wiring 114 would be prevented by the guard ring 130.

The metallized through silicon via opening 116, as shown in FIG. 2E, may extend through all of the BEOL wiring 114 and the semiconductor substrate 112. In other embodiments of the present disclosure, the metallized through silicon via opening 116 may extend only partially through the BEOL wiring 114 and/or the semiconductor substrate 112.

It is to be noted that the metallized through silicon via opening 116 may extend continuously through the BEOL wiring 114 and semiconductor substrate 112. By "continuously", it is meant that the metallized through silicon via opening 116 extends through the semiconductor chip 110 from or near surface 128 of the BEOL wiring 114 to or near surface 132 of the semiconductor substrate 112 in a straight path without any jogs to the side.

Figure 2F:
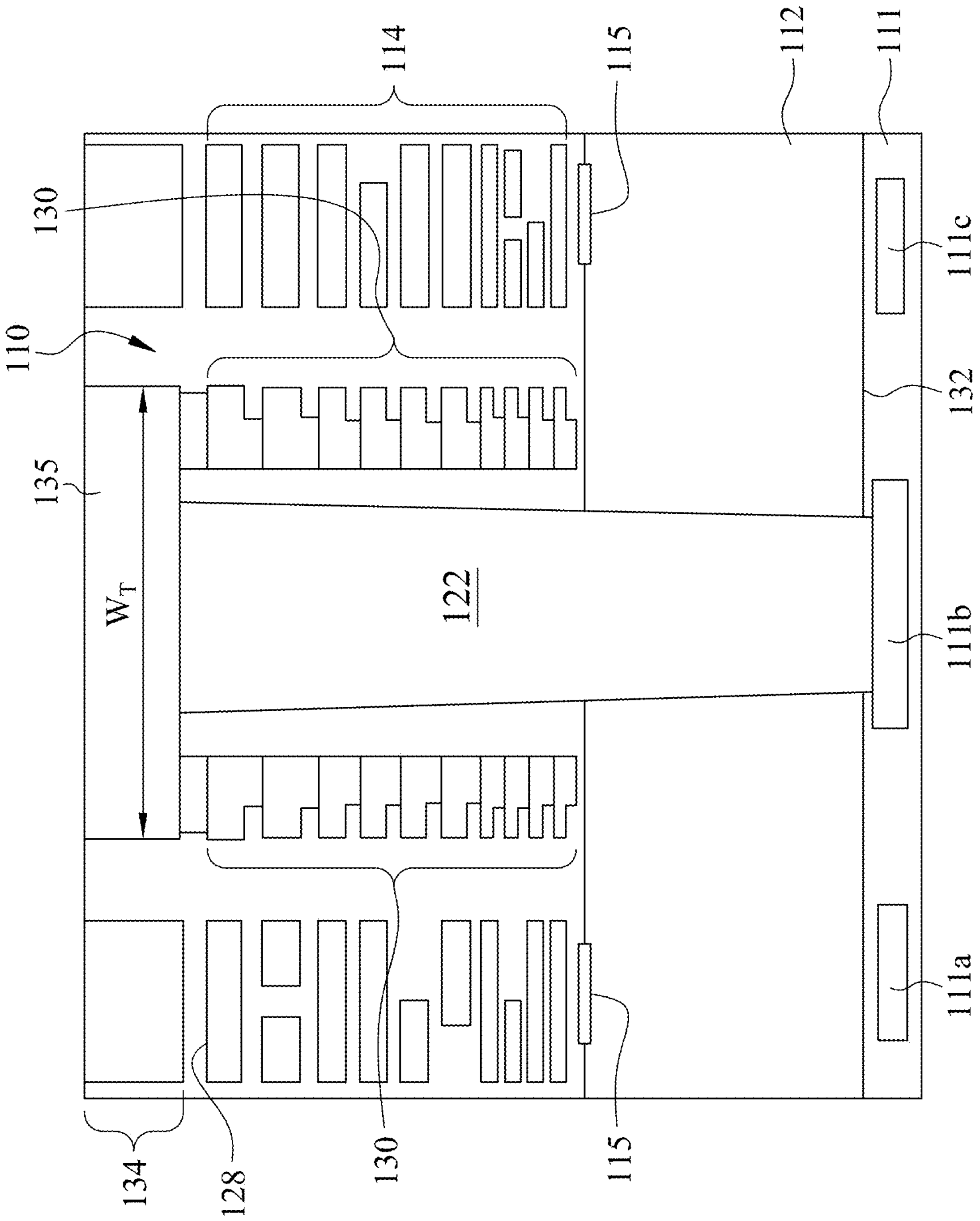

In the embodiment of FIG. 2F, a top metal layer 134 has been formed over portions of the surface 128 of BEOL wiring 114, an upper surface of guard ring 130 and an upper surface of metallization 122 in through silicon via opening 116. Formation of top metal layer 134 includes steps of forming an insulating dielectric material over surface 128 of BEOL wiring 114, an upper surface of guard ring 130 and an upper surface of metallization 122 in through silicon via opening 116, patterning such formed insulating dielectric material and forming additional metallization in the patterned insulating dielectric material over guard ring 130 and metallization 122 in through silicon via opening 116. Though not shown in FIG. 2F, an insulating layer or passivation layer, such as a combination of an oxide layer and a nitride layer, for example, a combination of an oxide layer and a layer of TEOS, Ti, TiN, Ta or TaN separates features of the top metal layer 134 from the dielectric material in which the BEOL wiring 114 is formed.

Figure 7:
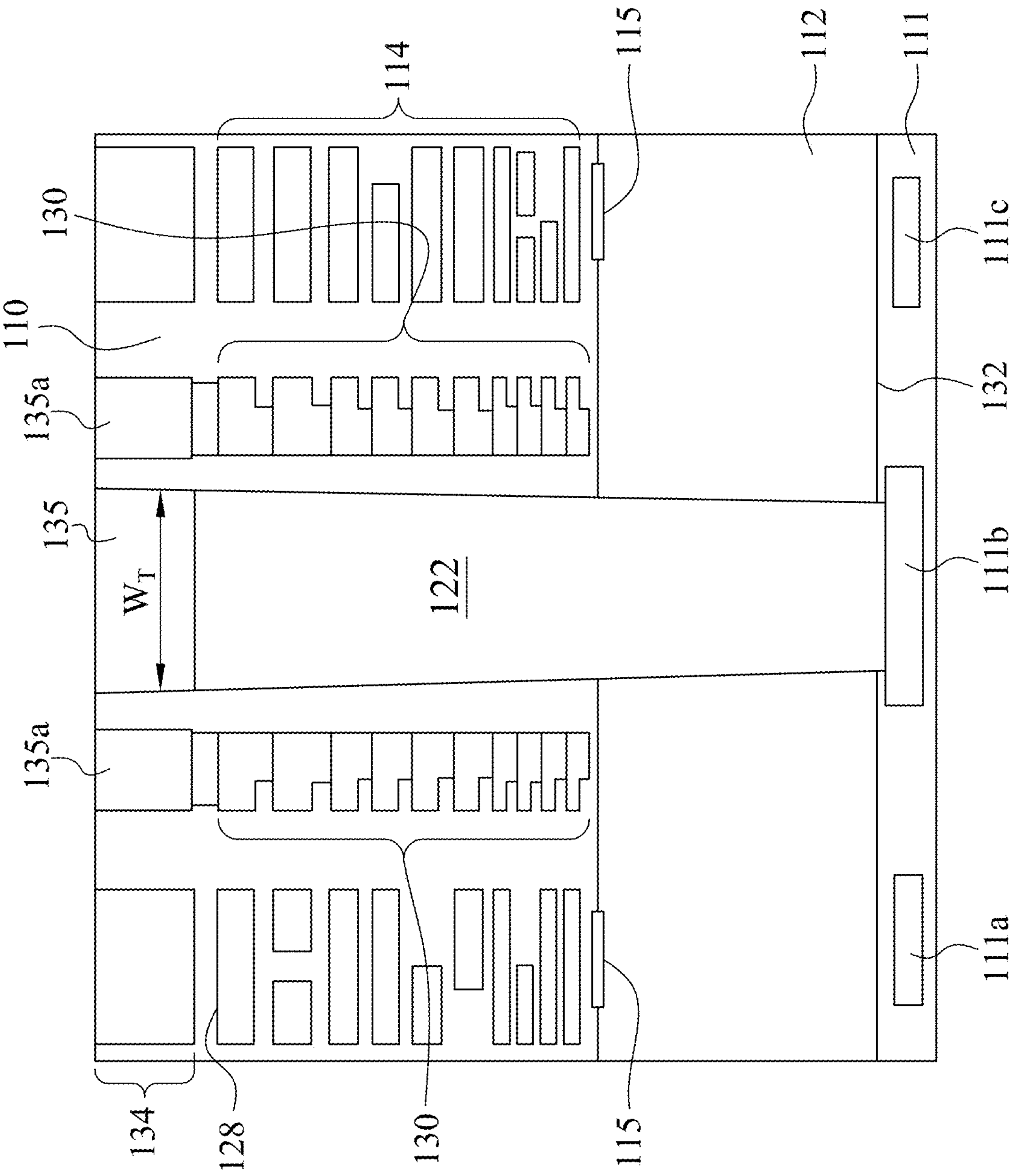
FIG. 7 is a cross-sectional view of a through silicon via and guard ring in accordance with some embodiments of the present disclosure.
Figure 8:
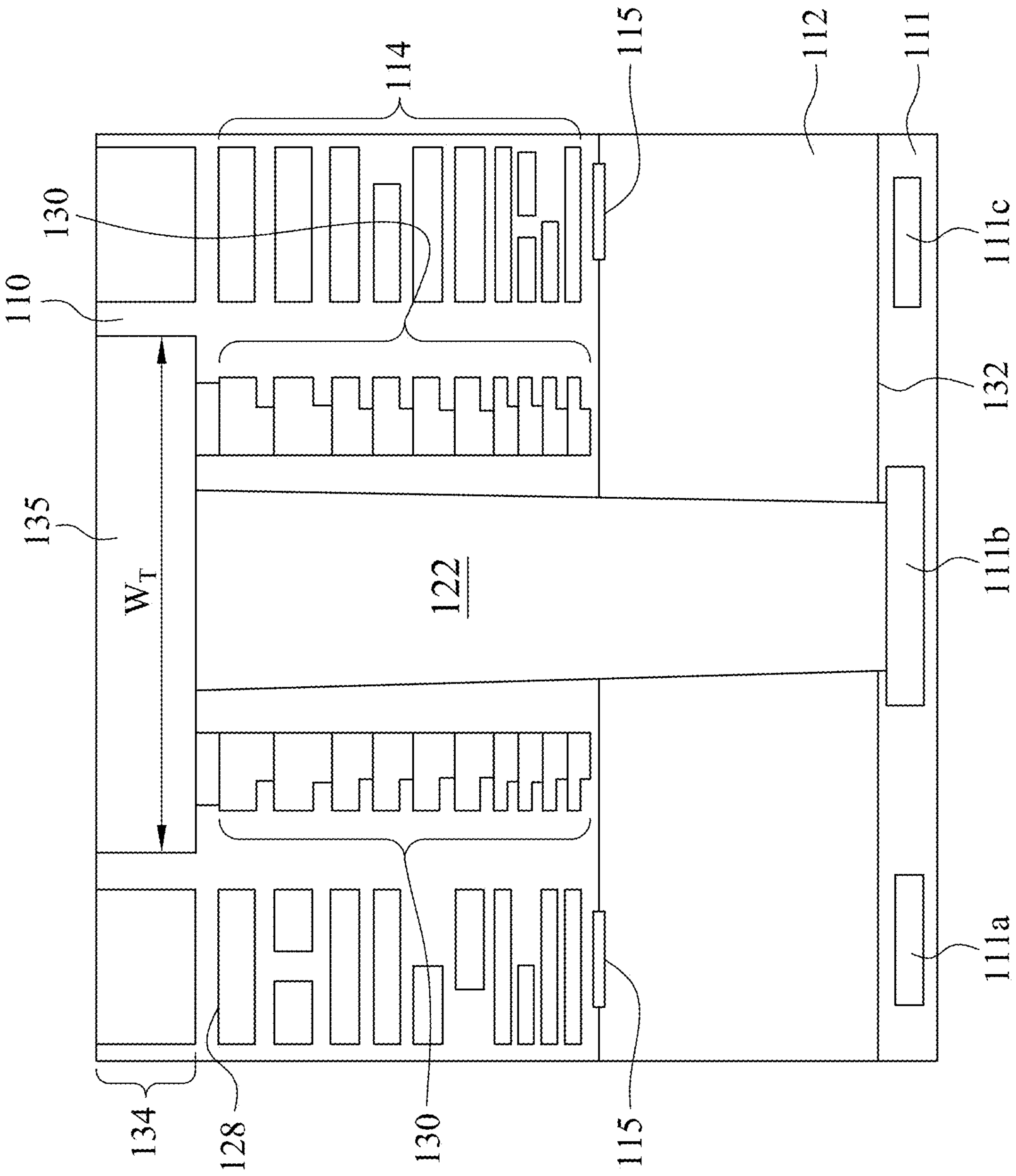
FIG. 8 is a cross-sectional view of the through silicon via and guard ring in accordance with some embodiments of the present disclosure.

In FIG. 2F, top metal layer 134 includes a portion 135 which has a width $W_T$ that is substantially equal to the diameter Dg (in FIG. 2G) of guard ring 130. Portion 135 extends over an upper surface of metallization 122 in through silicon via opening 116 and extends over an upper surface of the dielectric material between guard ring 130 and metallization 122 in through silicon via opening 116. Although portion 135 electrically connects metallization 122 to guard ring 130, in some embodiments as described above, guard ring 130 is an electrically inactive structure. In other embodiments, such as illustrated in FIG. 7, top metal layer 134 includes a portion 135 which has a width $W_T$ that is substantially equal to the diameter Da (in FIG. 2G) of metallization 122 in through silicon via opening 116. Top metal layer 134 also includes portion **135*a* over guard ring 130 which is separated from portion 135 by a dielectric material. With such structure, guard ring 130 is electrically isolated from metallization 122. Referring to FIG. 8, in another embodiment, top metal layer 134 includes a portion 135 that has a width $W_T$ that is greater than a diameter Dg (in FIG. 2G) of guard ring 130. In accordance with embodiments of the present disclosure, a ratio of Dg (described below with reference to FIG. 2G) to $W_T$ ranges between about 1:0.5 to 1:2. In other embodiments the ratio of Dg to $W_T$ ranges between about 1:0.75 to 1:1.5. When the ratio of Dg to $W_T$ falls below these ranges the density of the number of TSVs in the layer containing the BEOL wiring will be reduced due to the larger relative size of the portion 135 of metal layer 134**. When the ratio of Dg to $W_T$ is above these ranges, the density of the number of TSVs in the layer containing the BEOL wiring will be reduced due to the larger relative size of the guard ring.

Figure 2G:
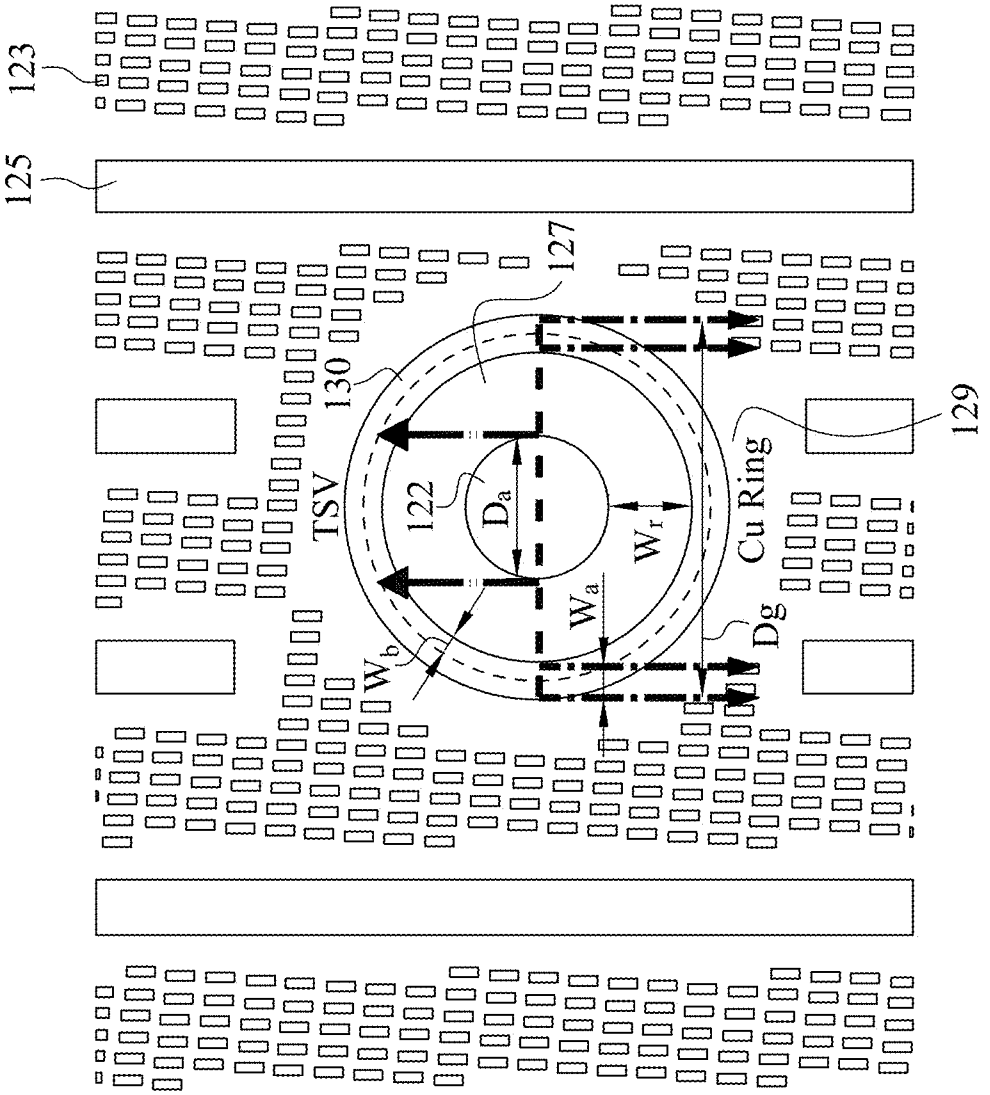
FIG. 2G is a top schematic view of a through silicon via and guard ring in accordance with some embodiments of the present disclosure.

In FIG. 2G a top view of TSV 122 and guard ring 130 is illustrated. In FIG. 2G a plurality of metal lines 125 and a plurality of dummy metal structures 123 are present to provide desired metal density in the BEOL. Such desired metal density can protect non-metal features from acid etching and can improve the planarity of the different BEOL layers by acting as a planarization step stop. TSV 122 is characterized by a diameter $D_a$ described below. $W_a$ is the width of a wiring portion 156 of a guard ring element **131*a* described below with reference to FIG. 3. TSV 122 is separated from guard ring 130 by a ring of insulating material 127 between guard ring 130 and dummy metal structures 123 and metal lines 125. A ratio of the width $W_r$ of ring 127 to $W_a$ ranges between about 1:1 to about 1:1.5. Wr ranges between about 0.3 to 0.5 micrometers. When the ratio of the width $W_r$ of ring 127 to Wa falls below 1:1.1, the potential for current leakage from TSV 122 two guard ring 130 increases. When the ratio of the width $W_r$ of ring 127 to Wa is greater than about 1:1.5, the density of the BEOL wiring is reduced due to the greater proportion of dielectric material between TSV 122 and guard ring 130. Guard ring 130 is electrically isolated from dummy metal structures 123 and metal lines 125 by dielectric 129. A ratio of Da to Wr ranges between about 3:1 to about 7:1. When the ratio of Da to Wr is below about 3:1, the performance of the TSV may be adversely effected. When the ratio of Da to Wr is above about 7:1, the likelihood of current leakage from TSV 122** increases.

Figure 3:
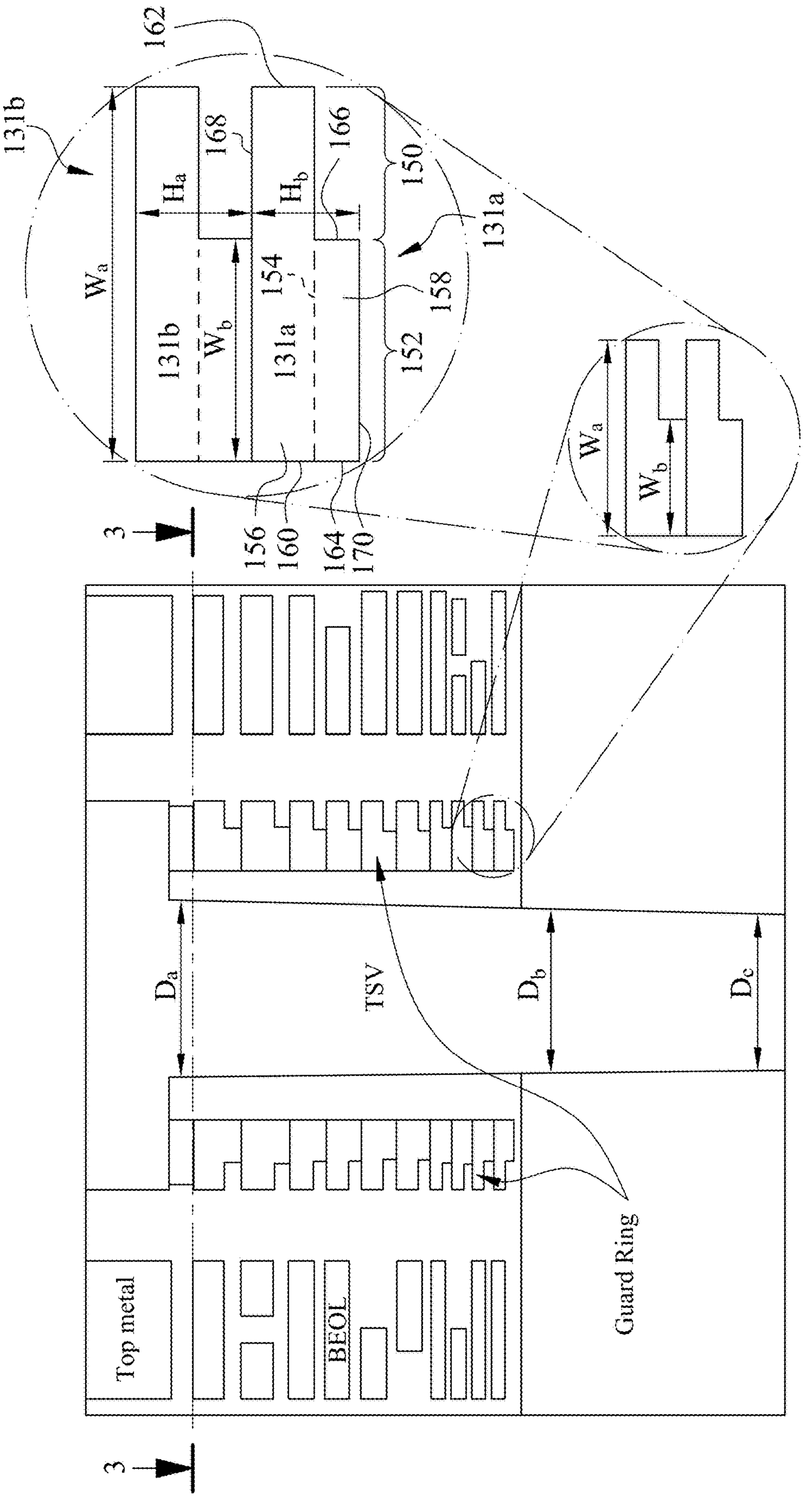
FIG. 3 is a cross-sectional view similar to FIG. 2D with two guard ring elements in accordance with some embodiments of the present disclosure exploded.

Referring to FIG. 3, a portion of two elements **131*a* and 131*b* of guard ring 130 are illustrated in an enlarged view. In the embodiment of FIG. 3, guard ring element 131*a* and guard ring element 131*b* are identical. Accordingly, only guard ring element 131*a* will be described below. The description of guard ring element 131*a* also applies to guard ring element 131*b*. Guard ring element 131*a* includes an upper section 150 and a lower section 152. In the embodiment illustrated in FIG. 3, upper section 150 is rectangular-shaped and lower section 152 is also rectangular-shaped. Upper section 150 is a smaller rectangle than lower section 152. The dotted line 154 in lower section 152 is an imaginary line separating an upper section 156 of guard ring element 131*a* from a lower section 158 of guard ring element 131*a*. In accordance with some embodiments of the present disclosure, upper section 156 is formed using the same semiconductor process that forms a metal wiring layer of the BEOL wiring 114. Lower section 158 is formed using the same process that forms a via between two layers of the BEOL wiring 114. Upper section 156 may be referred to below as a wiring section of guard ring element 131*a* and lower section 158 may be referred to below as a via section of guard ring element 131*a*. Upper section 156 includes a first surface 160 and a second surface 162 that are spaced apart a distance indicated by $W_a$. $W_a$ is a width of the wiring section 156 of guard ring element 131*a*. In the embodiment illustrated in FIG. 3, a distance between first surface 160 and metallization 122 in through silicon via opening 116 is less than a distance between second surface 162 and metallization 122 in through silicon via opening 116. Lower section 158 includes a first surface 164 and a second surface 166 that are spaced apart a distance indicated by $W_b$. $W_b$ is a width of the via section 158 of guard ring element 131*a*. In the embodiment illustrated in FIG. 3, a distance between first surface 164 and metallization 122 in through silicon via opening 116 is less than a distance between second surface 166 and metallization 122 in through silicon via opening 116. In other words, $W_a$ is different from $W_b$. In the embodiment illustrated in FIG. 3, the distance between second surface 162 and metallization 122 in through silicon via opening 116 is greater than the distance between second surface 166 and metallization 122 in through silicon via opening 116. In the embodiment illustrated in FIG. 3, guard ring element 131***a* includes a dimension $H_b$ parallel to first surfaces 160 and 164. In FIG. 3, dimension $H_b$ extends between an upper surface 168 of guard ring element 131*a* and a lower surface 170 of guard ring element 131*a*. In the embodiment illustrated in FIG. 3, the dimension $H_b$ of some of the guard ring elements 131*a*-131*j* are different. For example, in FIG. 3, $H_b$ of guard ring element 131*j* is greater than $H_b$ of other guard ring elements, e.g., guard ring elements 131*a*-131*h*. For example, $H_b$ of guard ring element 131*a* may be different than $H_a$ of guard ring element 131*b*. In view of the identical nature of guard ring element 131*a* and guard ring element 131*b* in FIG. 3, the description above of features 150, 152, 154, 156, 158, 160, 162, 164, 166, 168 and 170 is also applicable to guard ring element 131*b*, as well as guard ring elements 131*c*-131*j*. In view of the identical nature of guard ring element 131*a* and guard ring element 131*b*, the description of guard ring element 131*a* dimensions $W_a$, $W_b$ and $H_b$ also applies to guard ring element 131*b*. In some embodiments, the guard ring elements 131*a*-131*j* all have the same dimensions. In other embodiments, the guard ring elements 131*a*-131*j* all have different dimensions. In yet other embodiments, some of the guard ring elements 131*a*-131*j* have the same dimensions and some of the guard ring elements 131*a*-131*j* have different dimensions. For example, $W_a$ of guard ring element 131*a* can be different from $W_a$ of one or more of the other guard ring elements 131*b*-132*j* while the remaining guard ring elements have the same $W_a$. For example, $W_b$ of guard ring element 131*a* can be different from $W_b$ of one or more of the other guard ring elements 131*b*-132*j* while the remaining guard ring elements have the same $W_b$. While the embodiment of FIG. 3 shows 10 guard ring elements, in other embodiments of the present disclosure, BEOL wiring 114 includes more than 10 guard ring elements and in other embodiments, BEOL wiring 114 includes fewer than 10 guard ring elements.

In accordance with some embodiments of the present disclosure the ratio of $W_a$ to $W_b$ is between about 1.8 and 1.1. In other embodiments, the ratio of $W_a$ to $W_b$ is between about 1.6 and 1.2. When the ratio of $W_a$ to $W_b$ is above 1.8 the wiring portion 156 of a guard ring element 131*a* becomes too close to adjacent wire elements of BEOL wiring 114 and increases the likelihood of the formation of an unwanted electrical path between BEOL wiring features and wiring portion 156 or between adjacent BEOL wiring features. When the ratio of $W_a$ to $W_b$ falls below 1.1, the guard ring element 131*a* may be ineffective at protecting the BEOL wiring from water that may be formed during the formation of the TSV. In some embodiments, $W_a$ ranges from 0.15 to 0.5 micrometers. In other embodiments, $W_a$ ranges from 0.2 to 0.4 micrometers. In some embodiments, $W_b$ ranges from 0.1 to 0.4 micrometers. In other embodiments, $W_b$ ranges from 0.1 to 0.3 micrometers In accordance with embodiments of the present disclosure, first surface 160 of guard ring element 131*a* and first surface 164 of guard ring element 131*b* are coplanar. In other embodiments of the present disclosure, first surface 160 and first surface 164 of guard ring element 131*a* and first surface 160 and first surface 164 of guard ring element 131*b* are coplanar. In yet other embodiments, one of a first surface 160 and/or a first surface 164 of one or more given guard rings is coplanar with one of a first surface 160 and/or a first surface 164 of one or more other guard rings. Guard ring elements having coplanar first surfaces 160 and/or second surfaces 164 of embodiments of the present disclosure are less likely to be damaged during the etching steps illustrated in FIGS. 2C and 2D and described above. When the guard ring has inner surfaces that are not coplanar there is an increased likelihood that the etching that forms the opening for the TSV may also etch some of the first surface 160 and/or first surface 164 of a guard ring element.

Figure 4A:
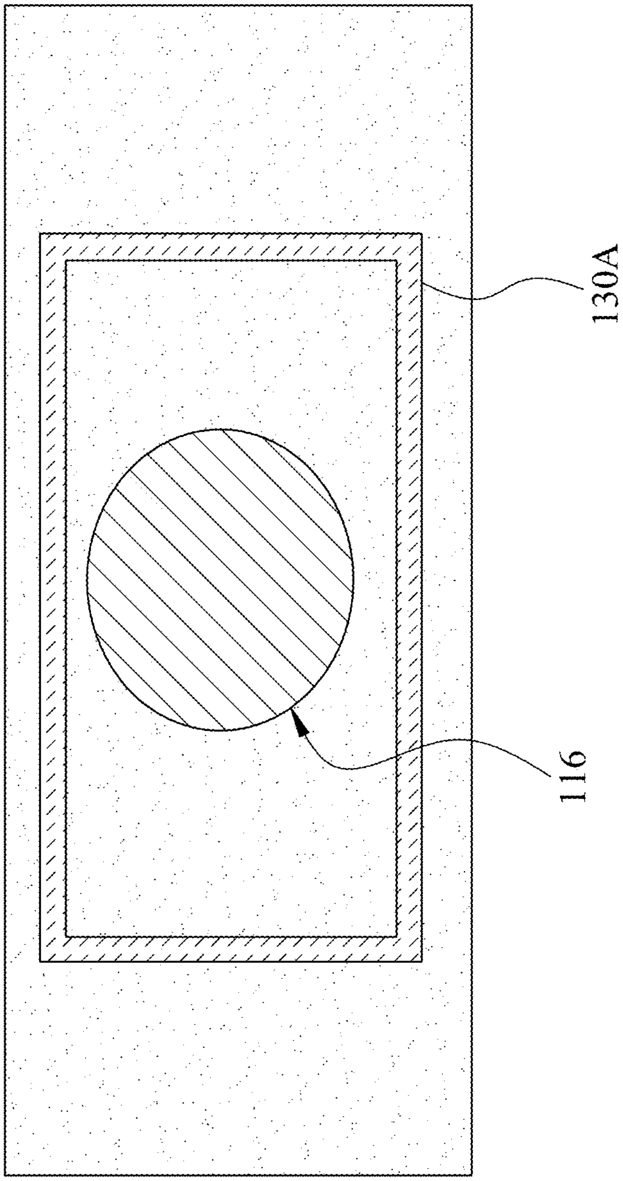
FIGS. 4A to 4E are cross-sectional views in the direction of arrow 3-3 in FIG. 3 illustrating various embodiments of the present disclosure of a guard ring in accordance with embodiments described herein.
Figure 4B:
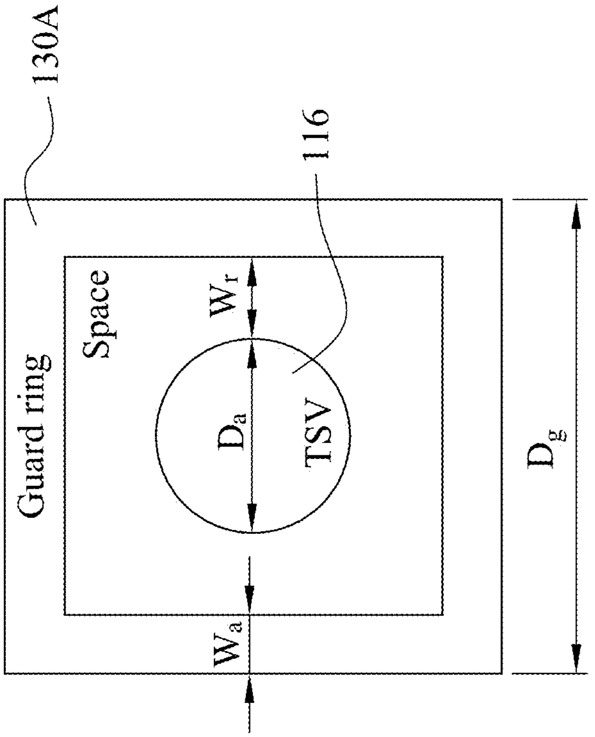
Figure 4C:
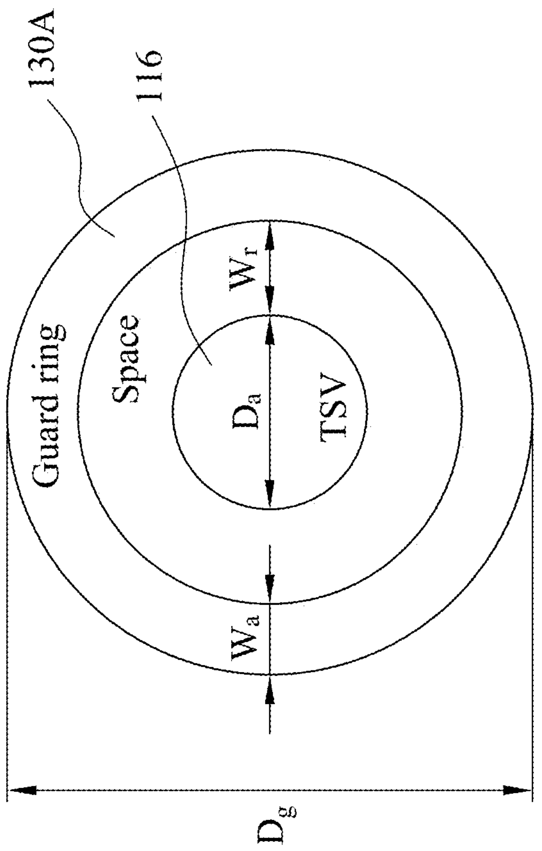
Figure 4D:
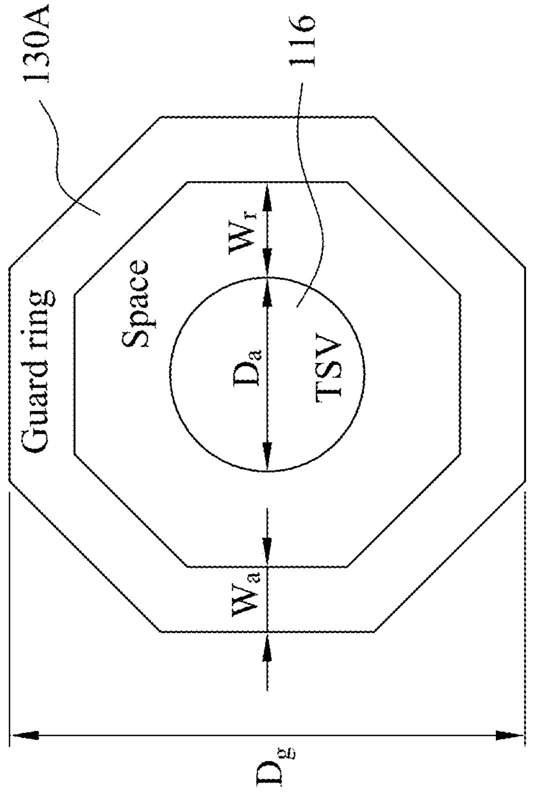
Figure 4E:
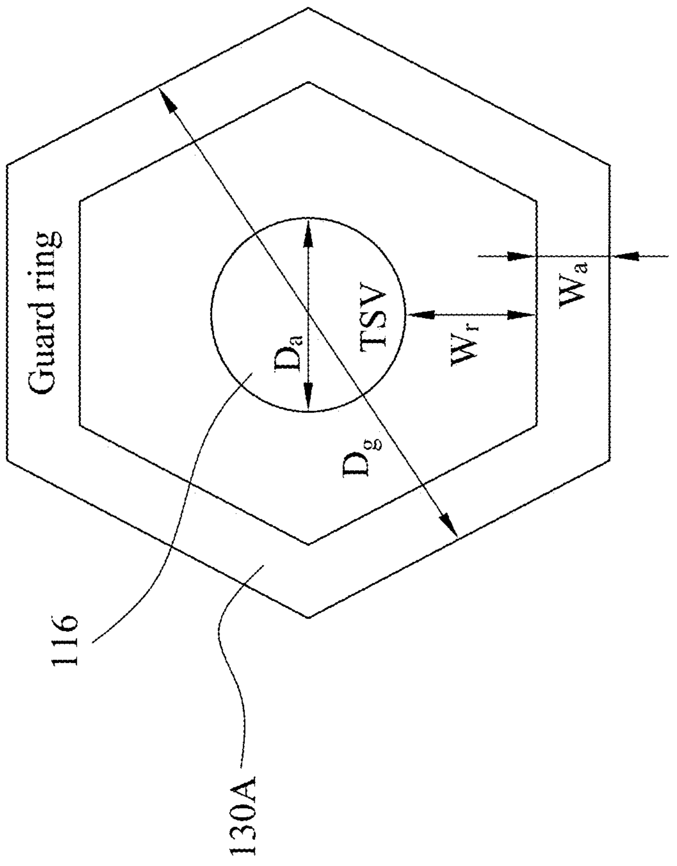
Figure 5:
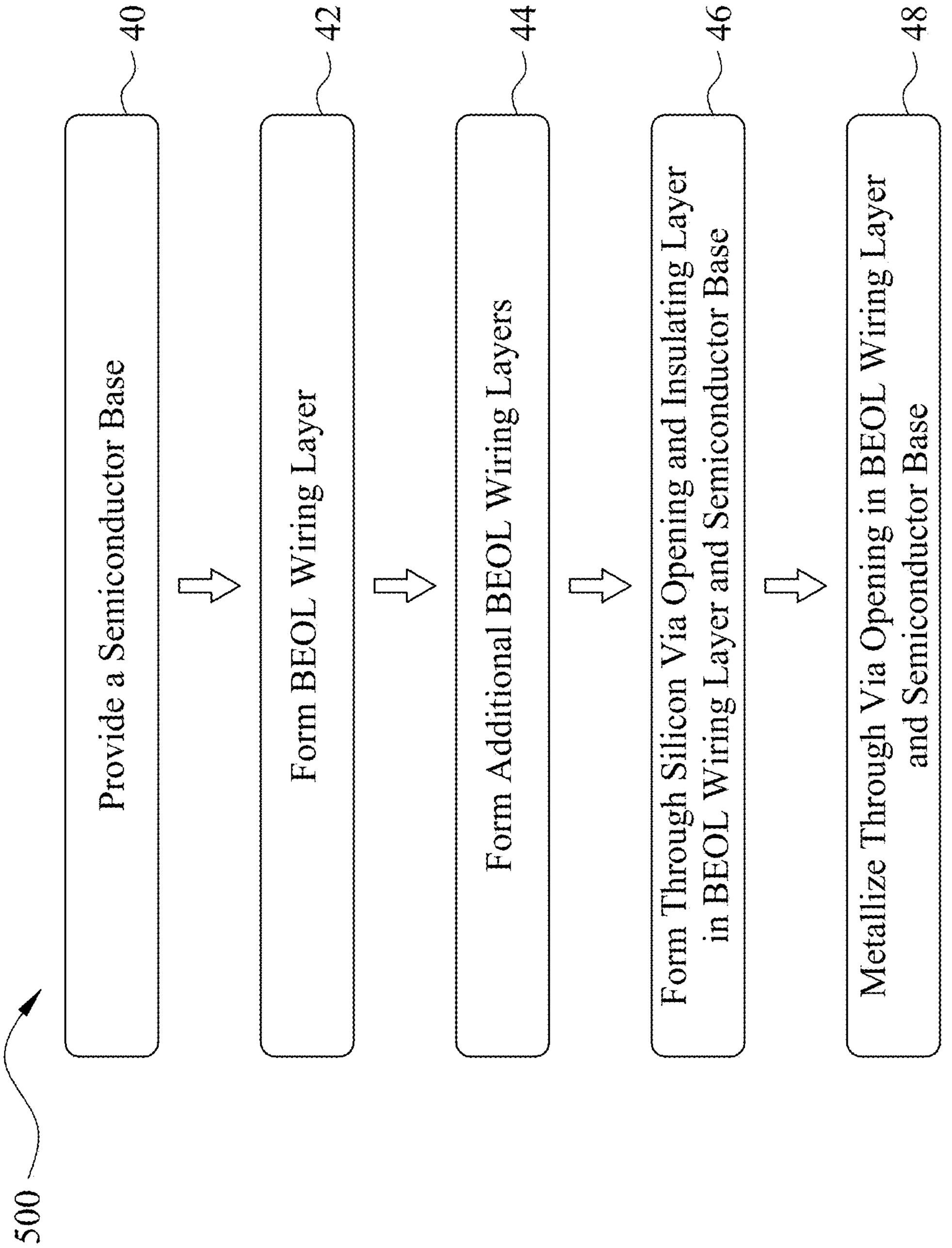
FIG. 5 is a flowchart illustrating a method according to an embodiment of the present disclosure.

The guard ring 130 may be formed in different shapes to fit the needs of the semiconductor design. FIGS. 4A to 4E are cross sections of the semiconductor chip 110 in the direction of arrows 3-3 of FIG. 3. In FIGS. 4A-4E, the top surface of wiring portion 156 of guard ring 131*j* having a dimension Wa described above is visible; however, via portion 158 having dimension Wb is underlying wiring portion 156 and is not visible. TSV 116 has a dimension Da described above. Guard ring 130A has a dimension Dg described above. Referring first to FIG. 4A, it can be seen that guard ring 130A is rectangular in cross section. In FIG. 4B, guard ring 130A is square in cross section while in FIG. 4C, guard ring 130A is circular in cross section. FIG. 4D illustrates an embodiment where the guard ring 130A is octagonal in cross section. FIG. 4E shows an embodiment where the guard ring 130A is hexagon in cross section. Metallized through silicon via opening 116 may be solid as shown in FIGS. 4A-4E and in other embodiments, metallized through silicon via 116 may be hollow in the center. FIGS. 4A to 4E are only examples of guard ring cross sections and are not meant to be limiting. In FIGS. 4B, 4C, 4D and 4E the space between the TSV and the inner circumference or surface of guard ring 130A is the dimension Wr in FIG. 2G.

The dimensions of the guard ring 130A and metallized through silicon via opening 116 will vary depending on the design requirements of the semiconductor chip. In an example of one embodiment, for purposes of illustration and not limitation, the metallized through silicon via 116 may have an outside diameter in the range of about 1 to 3 micrometer. In some embodiments, the guard ring 130A (FIG. 4B) may have an outside diameter in the range of about 2 to 4 micrometers. In some embodiments, the guard ring 130A has an inner diameter in the range of 1.5 to 3 micrometer. In some embodiments, the distance between opposing surfaces 164 or opposing surfaces 160 of a guard ring elements 131*c* and the via 116 is in the range of about 0.2 to 0.5 micrometers. When a guard ring element 131C is round, this results in an opening in the guard ring which is in the range of about 2.5 to 3.5 micrometers in diameter. In some embodiments, the ratio of $W_a$ to the inner diameter of guard ring element 131C is about 1 to 1.5. When the ratio of $W_a$ to the inner diameter of guard ring element 131C is less than about 1, the guard ring element 131C may be ineffective at isolating the BEOL wiring from water that may be formed during the formation of the TSV. When the ratio of Wa to the inner diameter of guard ring element 131C is greater than about 1.5, the wiring portion of guard ring element 131C becomes too close to adjacent wire elements of BEOL wiring 114 and increases the likelihood of the formation of an unwanted electrical path between BEOL wiring features. In some embodiments, the ratio of $W_b$ to the inner diameter of guard ring element 131C is slightly greater than 1. When the ratio of $W_b$ to the inner diameter of guard ring element 131C is less than 1, the guard ring element 131C may be ineffective at isolating the BEOL wiring from water that may be formed during the formation of the TSV.

Figure 6A:
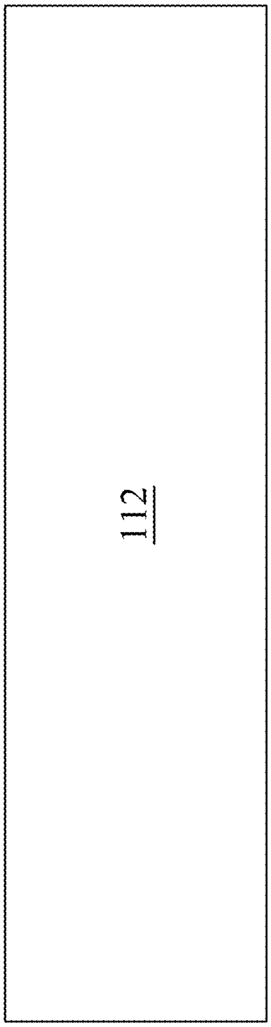
FIGS. 6A to 6E are cross-sectional views illustrating a method according to an embodiment of the present disclosure.
Figure 6B:
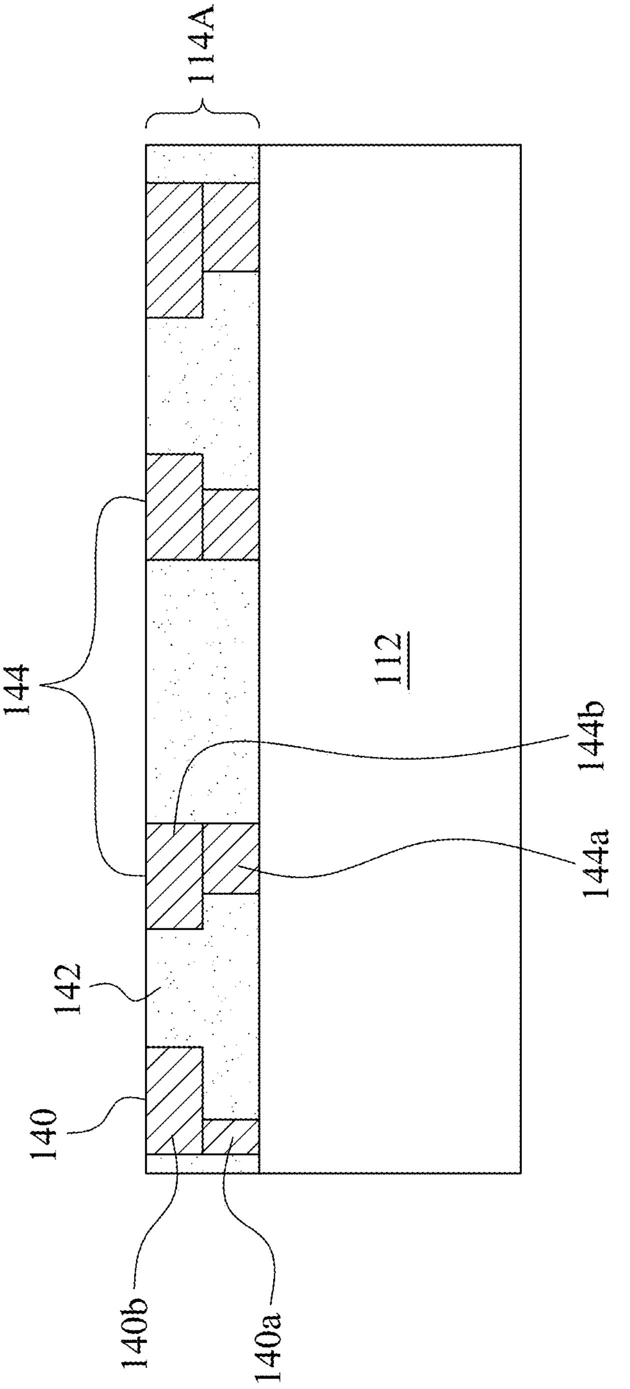
Figure 6C:
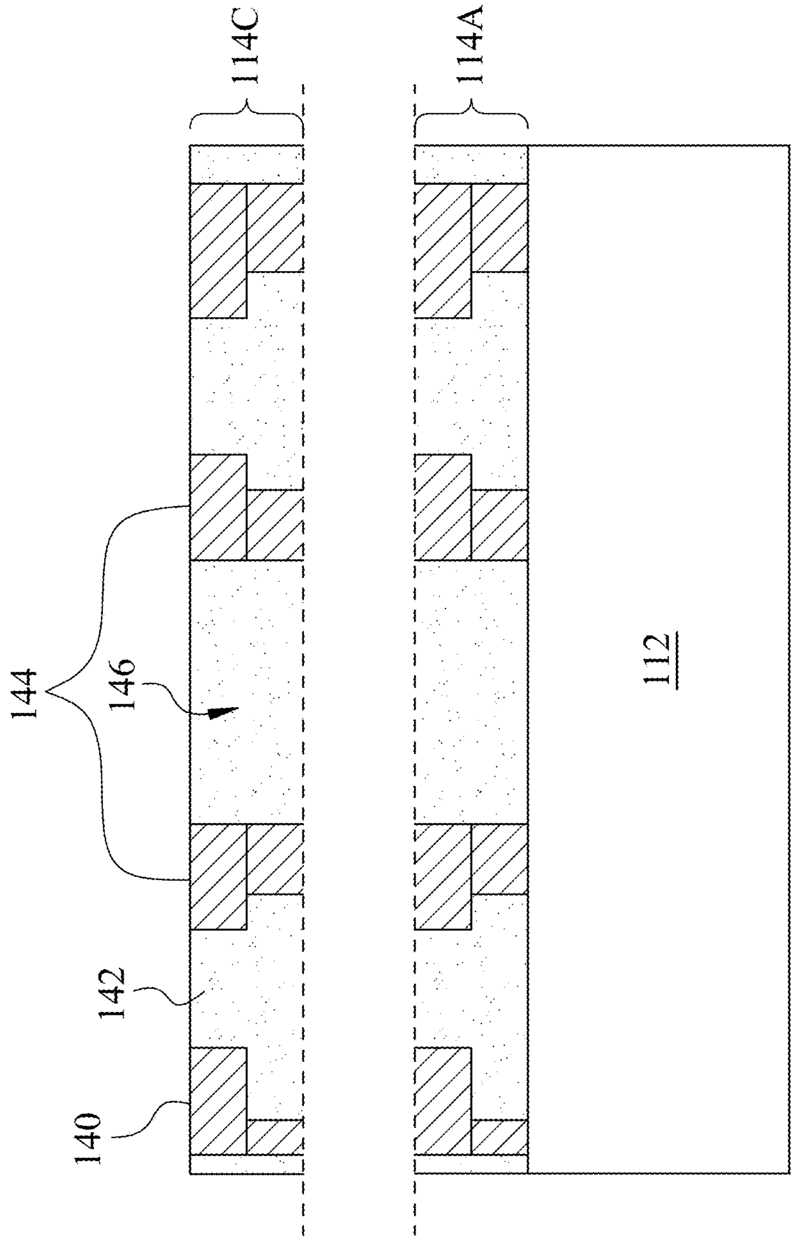
Figure 6D:
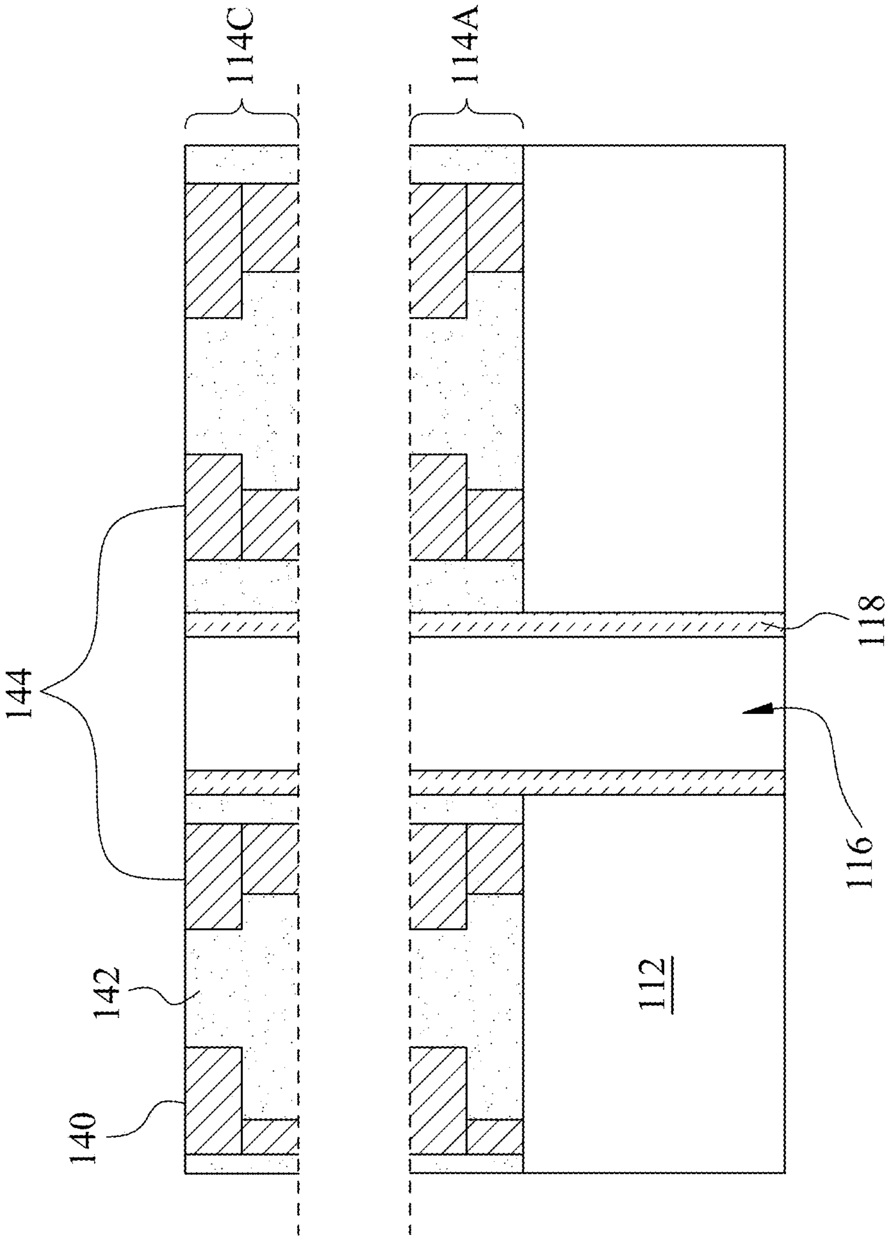
Figure 6E:
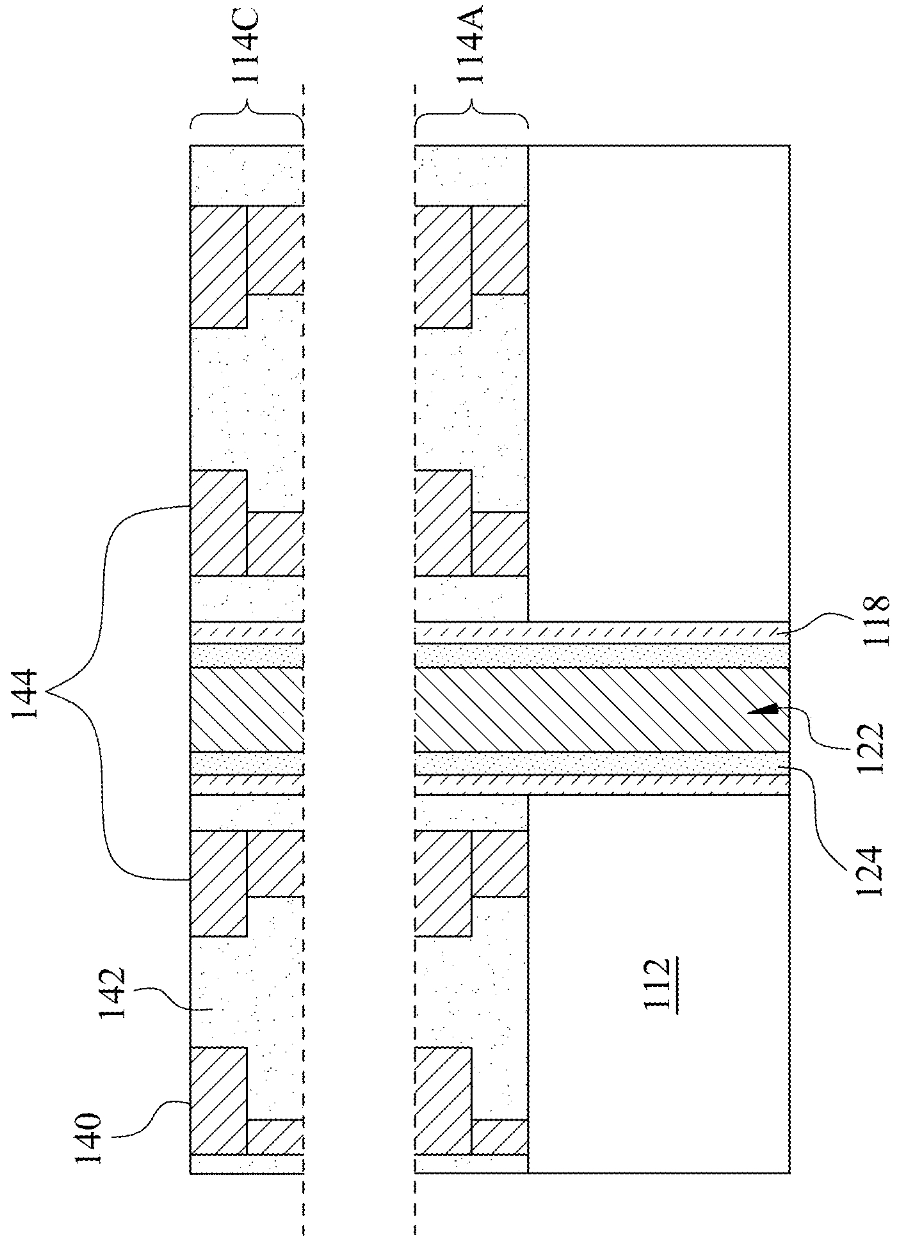

The method 500 of forming a semiconductor article having a through silicon via and a guard ring will be next described with reference to FIG. 5 and FIGS. 6A to 6E. In a first step of the method, a semiconductor substrate 112 is provided, as indicated in box 40 in FIG. 5 and FIG. 6A. That is, a semiconductor wafer is prepared with all of the necessary semiconductor devices such as transistors, capacitors and the like. It should be understood that only a portion of the semiconductor wafer is shown in FIG. 6A. Next, a first BEOL wiring layer 114A is formed including metallization 140 and dielectric material 142 as indicated in box 42 in FIG. 5 and FIG. 6B. It is noted that BEOL wiring layer 114A contains a guard ring portion 144 which may or may not perform an electrical function in the BEOL wiring 114. The formation of BEOL wiring layer 114A includes formation of via portion 140*a* and wiring portion 140*b*. When via portion 140*a* and wiring portion 140*b* are formed, via portion 144*a* and wiring portion 144*b* or guard ring 144 are formed. These features and subsequent BEOL wiring layers and guard ring portions are formed using known methods. Additional BEOL wiring layers are formed until a predetermined number of BEOL wiring layers are formed to meet the design requirements of the semiconductor chip, as indicated in box 44 in FIG. 5 and FIG. 6C. As shown in FIG. 6C, there is one additional BEOL wiring layers 114C formed, but in practice there will usually be more such BEOL wiring layers formed, as indicated by the broken lines in FIG. 6C-6E. It is to be noted that the guard ring portions 144 of each BEOL wiring layer are stacked on top of the guard ring portion 144 of the preceding BEOL wiring layer. The various guard ring portions 144 form, for example, a square, rectangular, circular or other shape, as discussed above. Within the guard ring portions 144 is an open area 146 where the through silicon via 116 will be formed. As indicated in box 46 of FIG. 5 and FIG. 6D, the through silicon via 116 is formed in the open area 146 (and within guard ring portions 144) and an insulating layer 118 is formed on surfaces of the through silicon via opening 116. Lastly, the through silicon via opening 116 is metallized with an optional liner layer 124 and metallization 122, as indicated in box 48 of FIG. 5 and FIG. 6E. Semiconductor processing then proceeds in a conventional way.

In one embodiment, the present disclosure describes a semiconductor structure which includes a semiconductor substrate including a semiconductor material. The semiconductor structure further includes a back end of the line (BEOL) wiring portion on the semiconductor substrate. The back end of line wiring portion includes a plurality of wiring layers having metal layers and insulating material. A through silicon via is present in the back end of line wiring portion and in the semiconductor substrate. The semiconductor structure includes a guard ring surrounding the through silicon via in the back end of line wiring portion, the guard ring including a plurality of guard ring elements, each of the plurality of guard ring elements including an upper section and a lower section. The upper section of each of the plurality of guard ring elements includes a first surface and a second surface spaced apart a distance $W_a$, the first surface being closer to the through silicon via than the second surface. The lower section of each of the plurality of guard ring elements includes a first surface and a second surface spaced apart a distance $W_b$, the first surface of the lower section being closer to the through silicon via than the second surface of the lower section. In accordance with some disclosed embodiments, $W_a$ is different than $W_b$, and the first surface of one of the plurality of guard ring elements is coplanar with the first surface of another one of the plurality of guard ring elements.

According to a second aspect of embodiments disclosed herein, a method is provided of forming a semiconductor structure which includes a step of providing a semiconductor substrate including a semiconductor material. The method further includes a step of forming a back end of line (BEOL) wiring portion, the back end of line wiring portion including a plurality of metal layers, an insulating material and a guard ring. The guard ring includes a plurality of guard ring elements. Each of the plurality of guard ring elements includes an upper section and a lower section. The upper section of each of the plurality of guard ring elements includes a first surface and a second surface spaced apart a distance $W_a$, the first surface being closer to the through silicon via than the second surface. The lower section of each of the plurality of guard ring elements includes a first surface and a second surface spaced apart a distance $W_b$, the first surface of the lower section being closer to the through silicon via than the second surface of the lower section. In accordance with some embodiments, $W_a$ being different than $W_b$, and the first surface of one of the plurality of guard ring elements being coplanar with the first surface of another one of the plurality of guard ring elements. Disclosed methods further include a step of forming a through silicon via opening surrounded by the guard ring in the BEOL wiring portion and the semiconductor substrate. In accordance with some embodiments of the present disclosure the method includes metallizing the through silicon via opening.

According to a third aspect of some of the embodiments described herein, a semiconductor device is provided which includes a semiconductor substrate comprising a semiconductor material. The semiconductor device includes a back end of line (BEOL) wiring portion on the semiconductor substrate, the back end of line wiring portion including a plurality of metal layers and an insulating material. The semiconductor device also includes a through silicon via (TSV) in the semiconductor substrate and in the back end of line wiring portion, the through silicon via in the semiconductor substrate having a dimension $D_b$ adjacent the back end of line wiring portion and a dimension $D_c$ in the semiconductor substrate adjacent a surface of the semiconductor substrate opposite a surface adjacent the back end of line wiring portion. In some embodiments $D_b$ being greater than $D_c$. The device further includes a guard ring surrounding the through silicon via in the back end of line wiring portion. The guard ring includes a plurality of guard ring elements. Each of the plurality of guard ring elements includes an upper section and a lower section. The upper section of each of the plurality of guard ring elements includes a first surface and a second surface spaced apart a distance $W_a$, the first surface being closer to the through silicon via than the second surface. The lower section of each of the plurality of guard ring elements includes a first surface and a second surface spaced apart a distance $W_b$, the first surface of the lower section being closer to the through silicon via than the second surface of the lower section. In some embodiments, $W_a$ is different than $W_b$.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a semiconductor structure, comprising:

providing a semiconductor substrate comprising a semiconductor material;

forming a back end of line (BEOL) wiring portion, the back end of line wiring portion including a plurality of conductive layers, an insulating material and a guard ring, the guard ring including a plurality of guard ring elements, each of the plurality of guard ring elements including a first portion and a second portion, the first portion of each of the plurality of guard ring elements including a first surface and a second surface spaced apart from each other, the first surface being closer to a through silicon via than the second surface, the second portion of each of the plurality of guard ring elements including a first surface and a second surface spaced apart from each other, the first surface of the second portion being closer to the through silicon via than the second surface of the second portion, and the first surfaces of the first portion and the second portion of a first guard ring element of the plurality of guard ring elements are coplanar with the first surfaces of the first portion and the second portion of a second guard ring element of the plurality of guard ring elements that is adjacent to the first guard ring element; and forming a through silicon via (TSV) surrounded by the guard ring in the back end of line wiring portion.

2. The method of claim 1, wherein the forming a through silicon via includes removing insulating material from the back end of line wiring portion, performing a first removal step to remove a portion of the semiconductor material of the semiconductor substrate, and performing a second removal step to remove a remaining portion of the semiconductor material of the semiconductor substrate.

3. The method of claim 2, wherein forming a through silicon via further includes forming an electrically conductive through silicon via in the back end of line wiring portion and the semiconductor substrate.

4. The method of claim 3, wherein the through silicon via in the semiconductor substrate has a dimension $D_b$ adjacent the back end of line wiring portion and a dimension $D_c$ in the semiconductor substrate adjacent a surface of the semiconductor substrate opposite a surface adjacent the back end of line wiring portion, $D_b$ being greater than $D_c$.

5. The method of claim 1, wherein at least one of the plurality of conductive layers and at least a portion of the guard ring of the back end of line wiring portion are formed simultaneously.

6. The method of claim 2, wherein a first guard ring element has a dimension $H_a$ parallel to the first surface of the first guard ring element and a second guard ring element has a dimension $H_b$ parallel to the first surface of the second guard ring element, $H_a$ being different than $H_b$.

7. The method of claim 1, wherein the first surface and the second surface of the first portion of each of the plurality of guard ring elements are spaced apart from each other by a distance $W_a$, the first surface and the second surface of the second portion of each of the plurality of guard ring elements are spaced apart from each other by a distance $W_b$, wherein $W_a$ is greater than $W_b$.

8. A method of forming a semiconductor structure, comprising:

providing a semiconductor substrate comprising a semiconductor material;

forming a back end of line (BEOL) wiring portion, the back end of line wiring portion including a plurality of conductive layers, an insulating material and a guard ring, the guard ring including a plurality of guard ring elements, each of the plurality of guard ring elements including a first portion and a second portion, the first portion of each of the plurality of guard ring elements including a first surface and a second surface spaced apart from each other, the first surface being closer to a through silicon via than the second surface, the second portion of each of the plurality of guard ring elements including a first surface and a second surface spaced apart from each other, the first surface of the second portion being closer to the through silicon via than the second surface of the second portion, and the first surface of the first portion and the first surface of the second portion of one of the plurality of guard ring elements being coplanar with each other around the entire inner surface of the guard ring; and forming a through silicon via (TSV) surrounded by the guard ring in the back end of line wiring portion.

9. The method of claim 8, wherein the forming a through silicon via includes removing insulating material from the back end of line wiring portion, performing a first removal step to remove a portion of the semiconductor material of the semiconductor substrate, and performing a second removal step to remove a remaining portion of the semiconductor material of the semiconductor substrate.

10. The method of claim 9, wherein forming a through silicon via further includes forming an electrically conductive through silicon via in the back end of line wiring portion and the semiconductor substrate.

11. The method of claim 10, wherein the through silicon via in the semiconductor substrate has a dimension $D_b$ adjacent the back end of line wiring portion and a dimension $D_c$ in the semiconductor substrate adjacent a surface of the semiconductor substrate opposite a surface adjacent the back end of line wiring portion, $D_b$ being greater than $D_c$.

12. The method of claim 8, wherein at least one of the plurality of conductive layers and at least a portion of the guard ring of the back end of line wiring portion are formed simultaneously.

13. The method of claim 9, wherein a first guard ring element has a dimension $H_a$ parallel to the first surface of the first guard ring element and a second guard ring element has a dimension $H_b$ parallel to the first surface of the second guard ring element, $H_a$ being different than $H_b$.

14. The method of claim 8, wherein the first surface and the second surface of the first portion of each of the plurality of guard ring elements are spaced apart from each other by a distance $W_a$, the first surface and the second surface of the second portion of each of the plurality of guard ring elements are spaced apart from each other by a distance $W_b$, wherein $W_a$ is greater than $W_b$.

15. A method of forming a semiconductor structure, comprising:

providing a semiconductor substrate comprising a semiconductor material; and forming a wiring structure, the wiring structure including a plurality of conductive layers, an insulating material, and a guard ring, the guard ring including a plurality of guard ring elements, each of the plurality of guard ring elements including a first portion and a second portion, the first portion of each of the plurality of guard ring elements including a first surface and a second surface spaced apart from each other, the first surface being closer to a through silicon via than the second surface, the second portion of each of the plurality of guard ring elements including a first surface and a second surface spaced apart from each other, the first surface of the second portion being closer to the through silicon via than the second surface of the second portion, and the first surfaces of the first portion and the second portion of a first guard ring element of the plurality of guard ring elements are coplanar with the first surfaces of the first portion and the second portion of a second guard ring element of the plurality of guard ring elements that is adjacent to the first guard ring element.

16. The method of claim 15, further comprising forming a through silicon via surrounded by the guard ring in the wiring structure, wherein the forming a through silicon via includes removing insulating material from the wiring structure, performing a first removal step to remove a portion of the semiconductor material of the semiconductor substrate, and performing a second removal step to remove a remaining portion of the semiconductor material of the semiconductor substrate.

17. The method of claim 16, wherein forming a through silicon via further includes forming an electrically conductive through silicon via in the wiring structure and the semiconductor substrate.

18. The method of claim 17, wherein the through silicon via in the semiconductor substrate has a dimension $D_b$ adjacent the wiring structure and a dimension $D_c$ in the semiconductor substrate adjacent a surface of the semiconductor substrate opposite a surface adjacent the wiring structure, $D_b$ being greater than $D_c$.

19. The method of claim 15, wherein at least one of the plurality of conductive layers and at least a portion of the guard ring of the wiring structure are formed simultaneously.

20. The method of claim 16, wherein a first guard ring element has a dimension $H_a$ parallel to the first surface of the first guard ring element and a second guard ring element has a dimension $H_b$ parallel to the first surface of the second guard ring element, $H_a$ being different than $H_b$.

* * * * *